(12) United States Patent
Meisel et al.

(10) Patent No.: US 10,349,188 B2
(45) Date of Patent: Jul. 9, 2019

(54) MEMS MICROPHONE SYSTEM AND METHOD

(71) Applicants: Akustica, Inc., Pittsburgh, PA (US); Robert Bosch GmbH, Stuttgart (DE)

(72) Inventors: Daniel C. Meisel, Pittsburgh, PA (US); Bernhard Gehl, Wannweil (DE); Yujie Zhang, Sunnyvale, CA (US); Andrew Doller, Sharpsburg, PA (US); Gokhan Hatipoglu, Pittsburgh, PA (US)

(73) Assignees: Akustica, Inc., Pittsburgh, PA (US); Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/787,003

(22) Filed: Oct. 18, 2017

(65) Prior Publication Data

US 2019/0116429 A1 Apr. 18, 2019

(51) Int. Cl.
| | |
|---|---|
| *H04R 25/00* | (2006.01) |
| *H04R 19/04* | (2006.01) |
| *H04R 19/00* | (2006.01) |
| *H04R 7/04* | (2006.01) |
| *B81B 7/00* | (2006.01) |

(52) U.S. Cl.
CPC .......... *H04R 19/04* (2013.01); *B81B 7/0061* (2013.01); *H04R 7/04* (2013.01); *H04R 19/005* (2013.01); *B81B 2201/0257* (2013.01); *B81B 2203/0127* (2013.01); *B81B 2203/0136* (2013.01); *B81B 2203/04* (2013.01); *H04R 2201/003* (2013.01)

(58) Field of Classification Search
CPC combination set(s) only.
See application file for complete search history.

(56) References Cited

U.S. PATENT DOCUMENTS

| | | | |
|---|---|---|---|
| 2010/0170346 A1* | 7/2010 | Opitz | .................... B81B 3/0078 |
| | | | 73/718 |
| 2012/0260500 A1 | 10/2012 | Zhou | |
| 2015/0001647 A1* | 1/2015 | Dehe | .................... B81B 3/0021 |
| | | | 257/416 |
| 2016/0090300 A1 | 3/2016 | Tsai et al. | |
| 2016/0304337 A1 | 10/2016 | Miao | |
| 2017/0238107 A1* | 8/2017 | Walther | ............. B81C 1/00158 |
| | | | 381/58 |

FOREIGN PATENT DOCUMENTS

KR 101407914 B1 6/2014

OTHER PUBLICATIONS

International Search Report corresponding to International Patent Application No. PCT/US2017/057322 (12 pages).

* cited by examiner

*Primary Examiner* — Amir H Etesam
(74) *Attorney, Agent, or Firm* — Maginot Moore & Beck LLP

(57) ABSTRACT

A Microelectromechanical system (MEMS) microphone comprises a base unit and a driving system disposed on the base unit. The driving system comprises a first diaphragm, a second diaphragm spaced apart from the first diaphragm, and a comb finger counter electrode assembly comprising a moving electrode member, the counter electrode assembly is mechanically coupled to the first and second diaphragms. The driving system further comprises a side wall mechanically coupled the first diaphragm to the second diaphragm defining a sealed electrode region and the sealed electrode region having an encapsulated gas pressure and the comb finger counter electrode assembly is disposed within the sealed electrode region.

18 Claims, 28 Drawing Sheets

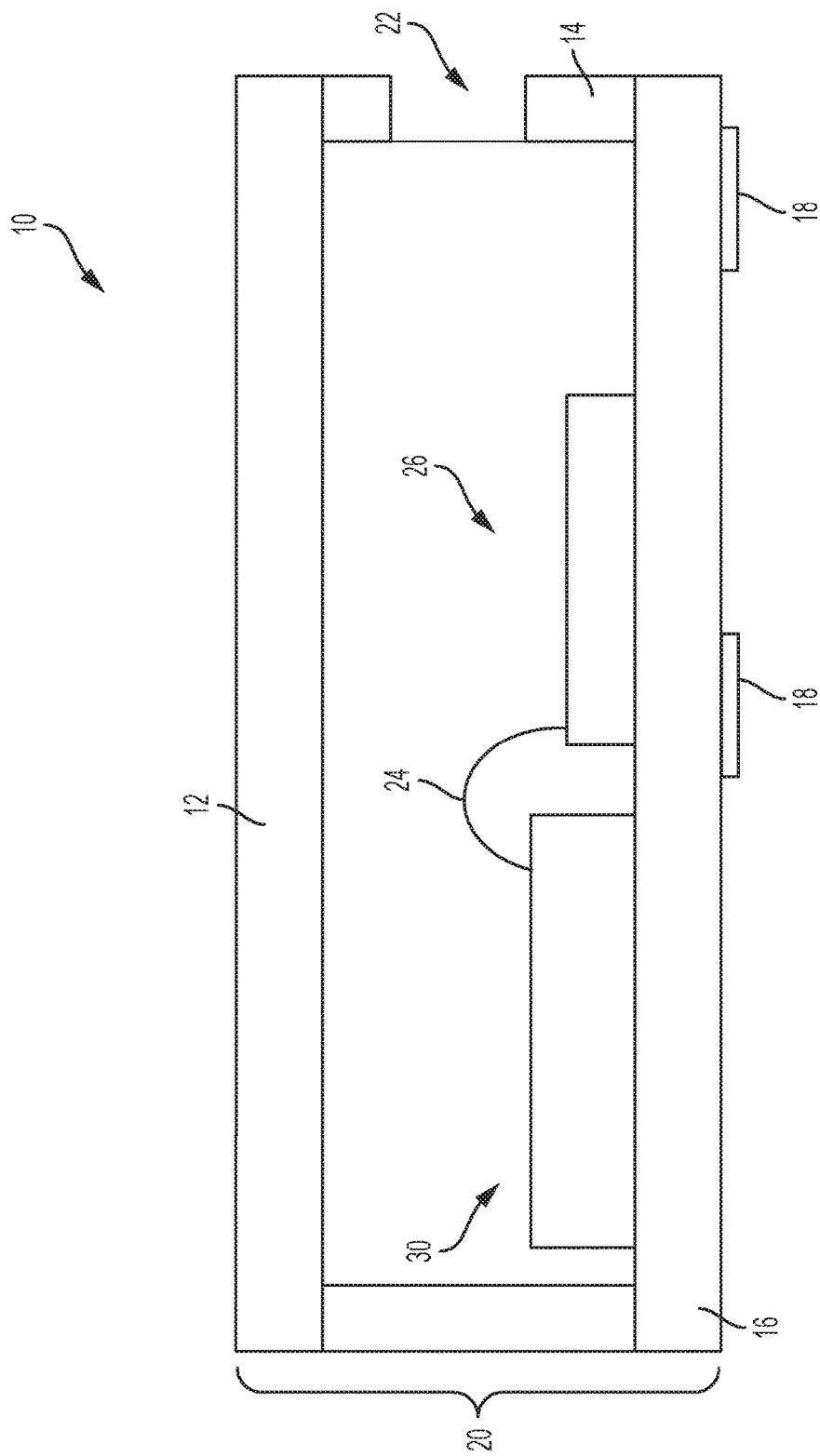

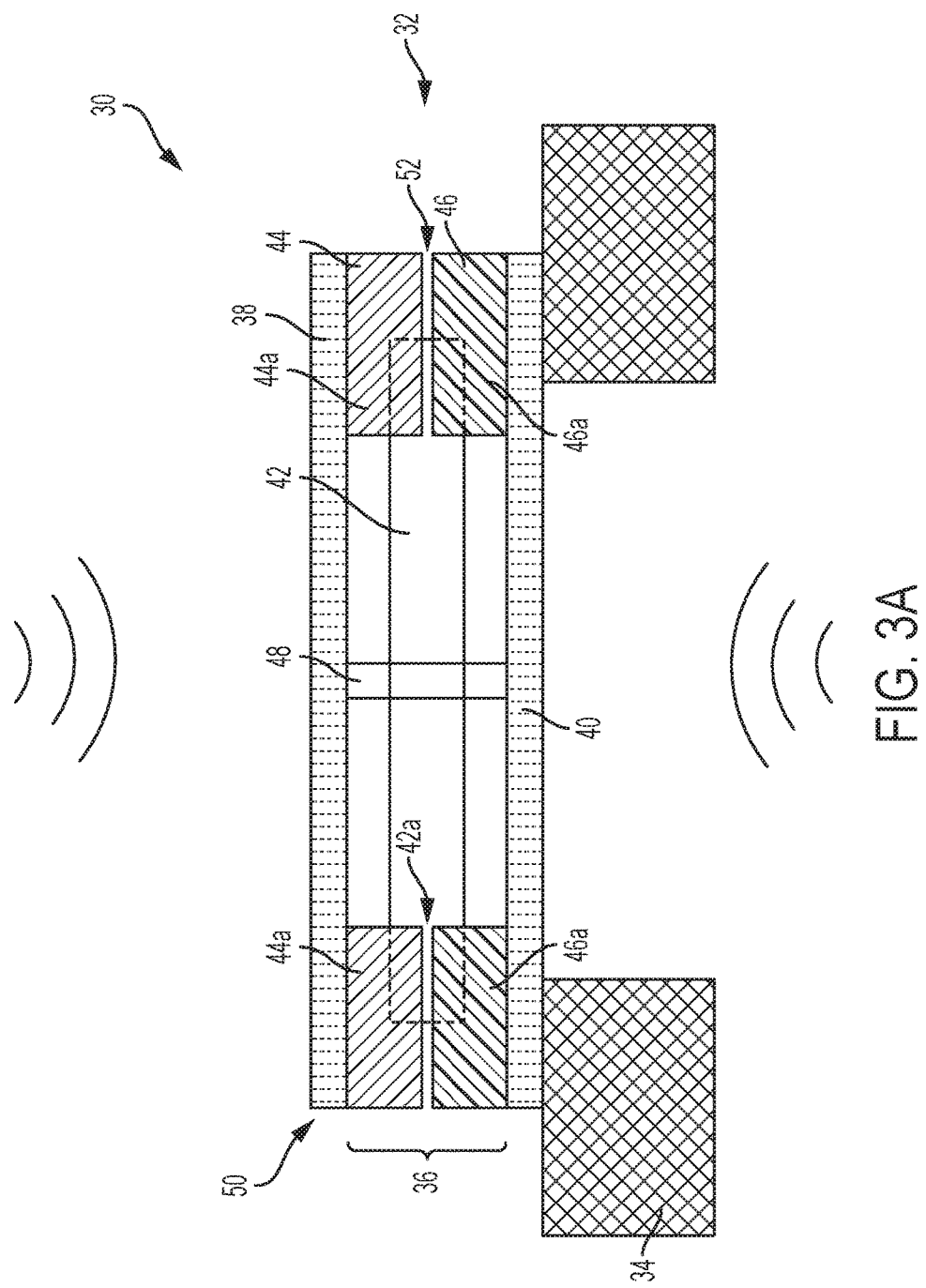

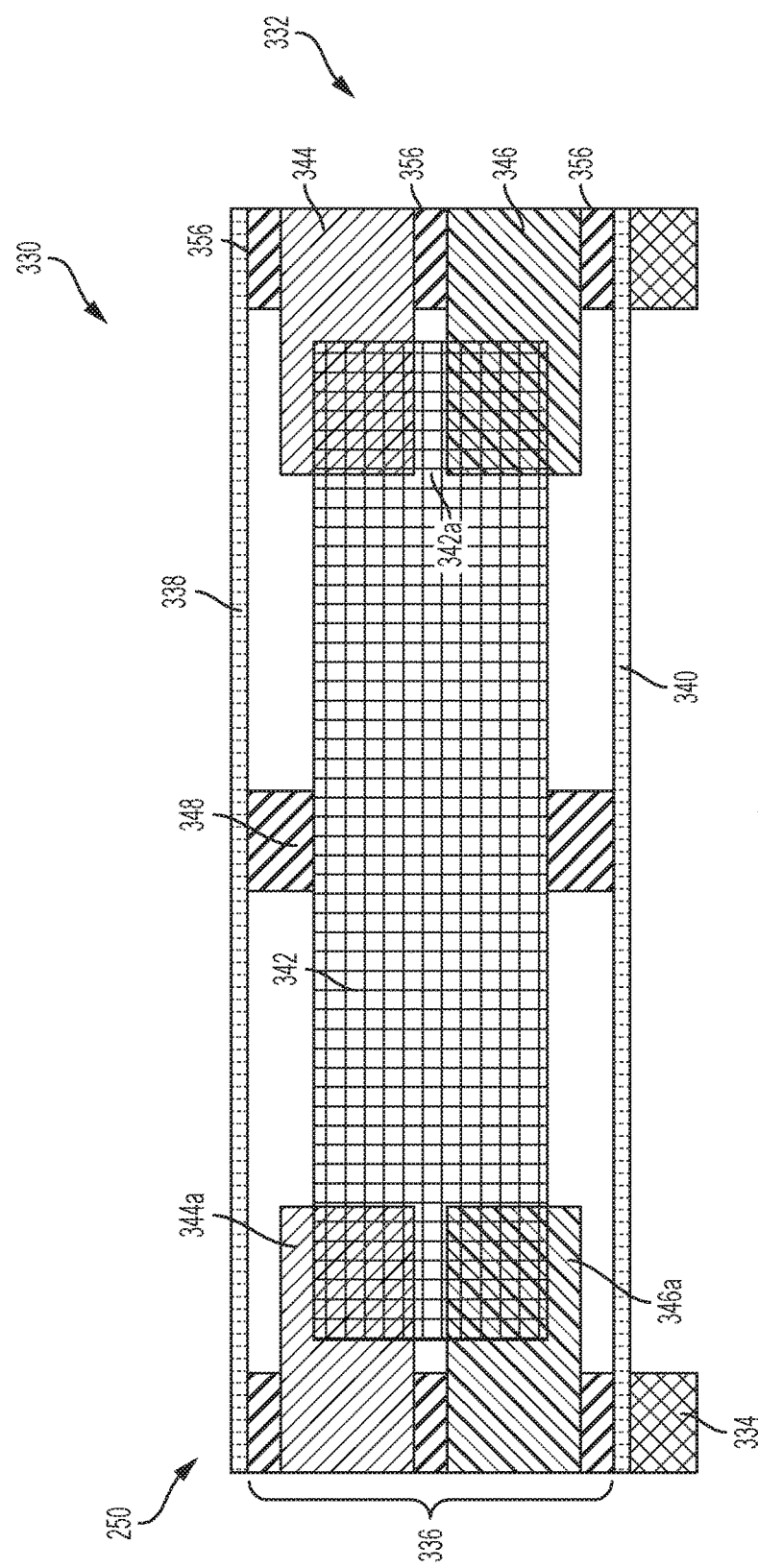

MEMS MICROPHONE SYSTEM AND METHOD

FIELD

This disclosure relates generally to Microelectromechanical System (MEMS) devices and, more particularly, to an electrode assembly for microphones.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Embodiments of the disclosure related to a MEMS microphone comprises a base unit, a driving system disposed on the base unit, the driving system comprises a first diaphragm and a second diaphragm spaced apart from the first diaphragm. The driving system further comprises a comb finger counter electrode assembly comprising a moving electrode member, the counter electrode assembly is mechanically coupled to the first and second diaphragms and a side wall mechanically coupled the first diaphragm to the second diaphragm defining a sealed electrode region, wherein the sealed electrode region having an encapsulated gas pressure and the comb finger counter electrode assembly is disposed within the sealed electrode region. The comb finger counter electrode assembly may or may not comprise a stationary electrode member. The first diaphragm is substantially made of a material having a low conductivity and the second diaphragm is substantially made of a material having a low conductivity. The comb finger counter electrode assembly comprises material having a conductivity. The movable electrode member is substantially made of a material having a conductivity. The stationary electrode member is made of a material having a conductivity. One or more of the diaphragms are substantially made of a material having a tensile residual stress. The comb finger counter electrode assembly comprises a material having a tensile residual stress. The MEMS microphone further comprises at least one or more of a connecting member mechanically coupled the counter electrode assembly to the first and second diaphragms and one or more pillars that are formed within the driving system. A leak hole formed on at least one of the pillar or the connecting member. The comb finger counter electrode assembly comprises at least two counter electrodes formed within the sealed electrode region.

In another aspect of the disclosure, a driving system comprises an electrode assembly and a comb finger counter electrode assembly. The electrode assembly comprises a first diaphragm, a second diaphragm spaced apart from the first diaphragm, and a gap formed between the first and second diaphragm. The comb finger counter electrode assembly formed within the first and second diaphragms comprises a moving electrode member, at least two counter electrode members, and a side wall mechanically coupled the two counter electrode members to the first and second diaphragms defining a sealed electrode region, wherein the sealed electrode region having an encapsulated gas pressure and the comb finger counter electrode assembly is disposed within the sealed electrode region. The first diaphragm is substantially made of a material having a low conductivity and the second diaphragm is substantially made of a material having a low conductivity. The movable electrode member is substantially made of a material having a conductivity. One or more of the diaphragms are substantially made of a material having a tensile residual stress. The comb finger counter electrode assembly comprises a material having a tensile residual stress. The MEMS microphone further comprises at least one or more of a connecting member mechanically coupled the counter electrode assembly to the first and second diaphragms and one or more pillars that are formed within the driving system. A leak hole formed on at least one of the pillar or the connecting member. The comb finger counter electrode assembly comprises at least two counter electrodes formed within the sealed electrode region.

BRIEF DESCRIPTION OF THE DRAWINGS

These and other features, aspects, and advantages of this disclosure will become better understood when the following detailed description of certain exemplary embodiments is read with reference to the accompanying drawings in which like characters represent like arts throughout the drawings, wherein:

FIG. 2C is a cross-sectional view of another microphone system of FIG. 1 with a side port in accordance with a described embodiment of the disclosure;

FIGS. 3A-3I are cross-sectional views of a microphone die mounted within the microphone system of FIG. 1 in accordance with various described embodiments of the disclosure;

FIG. 6 is a cross-sectional view of a driving system in accordance with various embodiments of the disclosure;

DETAILED DESCRIPTION

The following description is presented to enable any person skilled in the art to make and use the described embodiments, and is provided in the context of a particular application and its requirements. Various modifications to the described embodiments will be readily apparent to those skilled in the art, and the general principles defined herein may be applied to other embodiments and applications without departing from the spirit and scope of the described embodiments. Thus, the described embodiments are not limited to the embodiments shown, but are to be accorded the widest scope consistent with the principles and features disclosed herein.

The disclosure is a microphone system for a client machine. Within the client machine are several other electronic components, such as sensor devices, speakers, graphical processor units, computer processor units, host systems, cameras, and any suitable computer implemented devices either directly or indirectly coupled to the microphone system. The client machine may be a voice-controlled device, a voice-assistant device, a personal computer or desktop computer, a laptop, a cellular or smart phone, a tablet, a personal digital assistant (PDA), a gaming console, an audio device, a video device, an entertainment device such as a television, a vehicle infotainment, a wearable device, an entertainment or an infotainment remote control, a thin client system, a thick client system, or the like. Other suitable client machines regardless of size, mobility, or configuration may be suggested to include any number of microphone systems.

The microphone system includes a package housing or an enclosure for housing any number of sensor devices/dies, internal components, or combination thereof. The sensor devices/dies may be such as MEMS transducers, speakers, receivers, microphones, pressure sensors, thermal sensors, optical sensors, imaging sensors, chemical sensors, gyroscopes, inertial sensors, humidity sensors, accelerometers, gas sensors, environmental sensors, motion sensors, navigation sensors, vital sensors, tunnel magnetoresistive (TMR) sensors, proximity sensors, bolometers, or combination thereof. The microphones may be electret microphones, capacitive microphones, graphene microphones, piezoelectric microphones, silicon microphones, optical microphones, or any suitable acoustic microphones.

Figure 1:
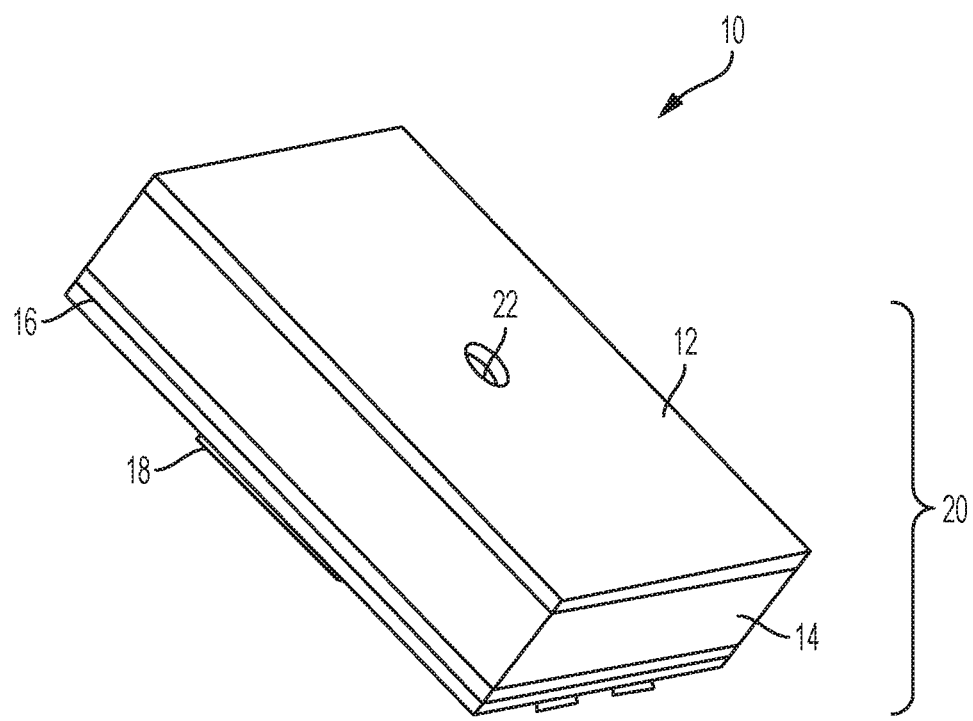
FIG. 1 is a perspective view of a microphone system in accordance with a described embodiments of a disclosure.

FIG. 1 is a perspective view of a MEMS microphone system 10 according to an embodiment of the disclosure. The MEMS microphone system 10 includes a package housing 20 having a lid 12, a spacer 14, and a substrate 16 attached to the spacer 14 by any suitable methods of attachment. More than one sensor device/die may be mounted within the microphone system 10. The sensor devices/dies may be MEMS transducers, speakers, receivers, microphones, pressure sensors, thermal sensors, optical sensors, imaging sensors, chemical sensors, gyroscopes, humidity sensors, inertial sensors, vital sensors, TMR sensors, accelerometers, gas sensors, environmental sensors, motion sensors, navigation sensors, proximity sensors, bolometers, or combination thereof. Optional components such as ASICs, integrated circuits, processors, controllers, energy storage devices, actuators, sensor circuits or any suitable circuitry may be mounted within the microphone system 10. Depending on the application, any number of opening 22 such as a port or a passageway for receiving attributes from an environment may be formed on any location of the package housing 20 by etching, piercing, drilling, punching, or any suitable methods. For example, the opening 22 may be formed either on the lid 12, the substrate 16, or the spacer 14. In some embodiments, the opening 22 may be formed on multiple locations of the package housing 20. The attributes may be acoustic signal, pressure signal, optical signal, gas signal, and any suitable signal. An optional barrier may be formed within the opening 22. The barrier is configured and functioned as a filter to remove debris, contamination, particles, vapor, fluid, or the like. In some embodiments, the barrier may formed on the outer surface of the housing 20 to cover the opening 22 so that debris, contamination, particles, or the like cannot penetrate into the housing. In yet another embodiments, the barrier may be formed below the opening 22 in which a portion of the barrier is attached to the inner surface of the housing 20 for filtering or removing debris, contamination, particles, or the like. In yet embodiments, the barrier may be fabricated directly onto the movable member such as a diaphragm. In yet another embodiment, the barrier is formed as a layered film or a layered material and may either integrated into the housing 20 during fabrication, or disposed on the outer or inner surface of the housing 20. In further yet another embodiment, as illustrated in FIG. 3C, a barrier formed as a rigid wall 45 coupled the top electrode member 38 to the bottom electrode member 40 for protecting the microphone against debris. The rigid wall 45 will be further described below. Although one barrier is described, multiple layers of barrier or any suitable number of barrier may be implemented on the MEMS package, depending on the application. The barrier not only functions as the particle removal while exposed to the environment via the opening 22, the barrier can also serve other purposes such as a shock absorber, or a vibration damper, or combination thereof.

Although the microphone system 10 as depicted comprises a multi-structure package housing 20, various aspects and configurations either in a single structure package housing, a two piece structure package housing, or multi-structure package housing may be used to encapsulate at least one internal component. As an example, the lid 12 and the spacer 14 may be formed as a single structure, defines a cover or a cap. One or more bonding pads 18 may be formed on the substrate 18, the lid 12, the spacer 14, or multiple locations of the package housing 20 by any suitable method. Once bonding pads 18 are introduced, the microphone system 10 can be easily mounted to an external printed circuit board or another support member of the client machine. In some embodiments, the package housing further includes an interposer coupled the cover 12 to either the spacer 14 or the substrate 16.

Figure 2A:
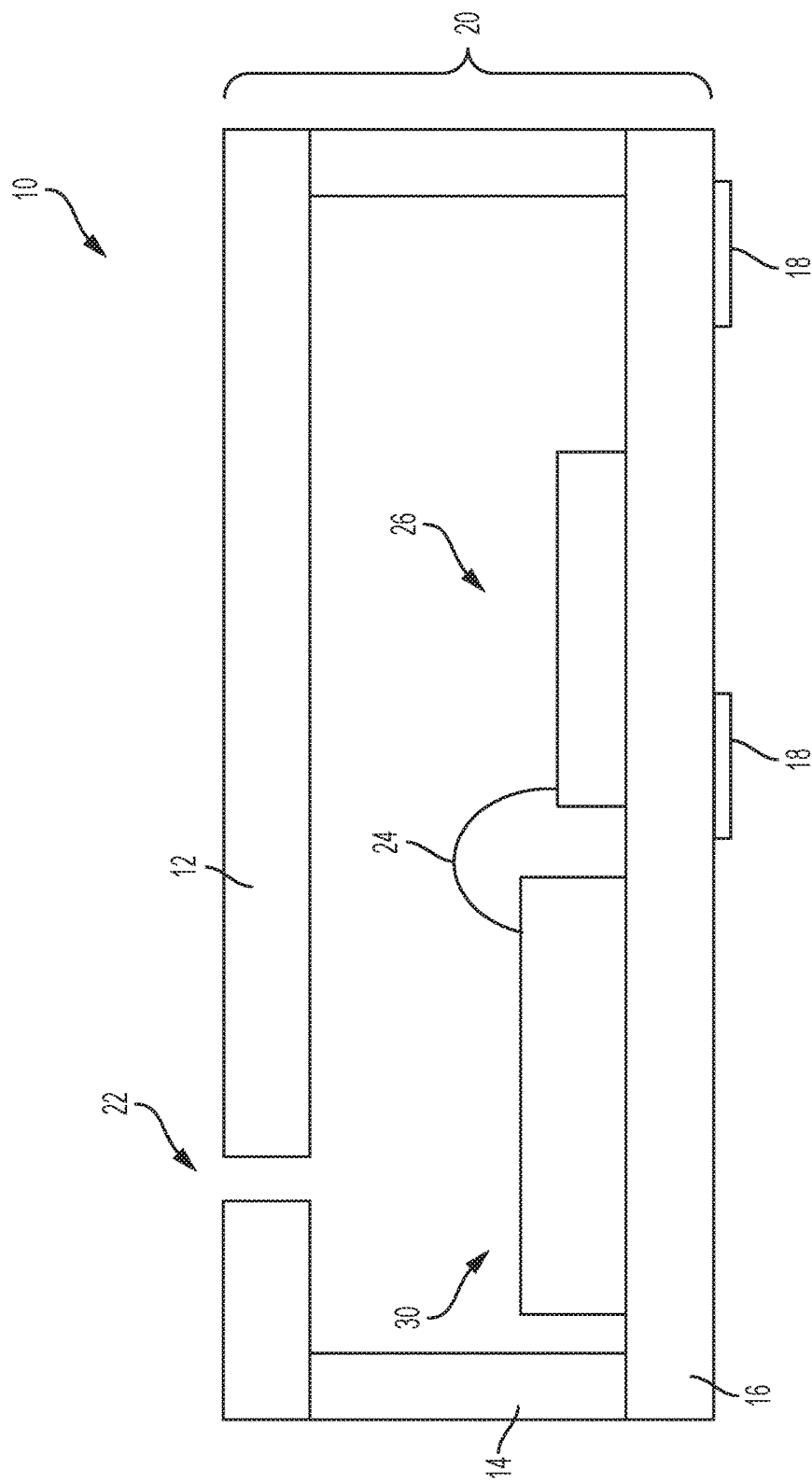
FIG. 2A is a cross-sectional view of the microphone system of FIG. 1 in accordance with a described embodiment of the disclosure.
Figure 2B:
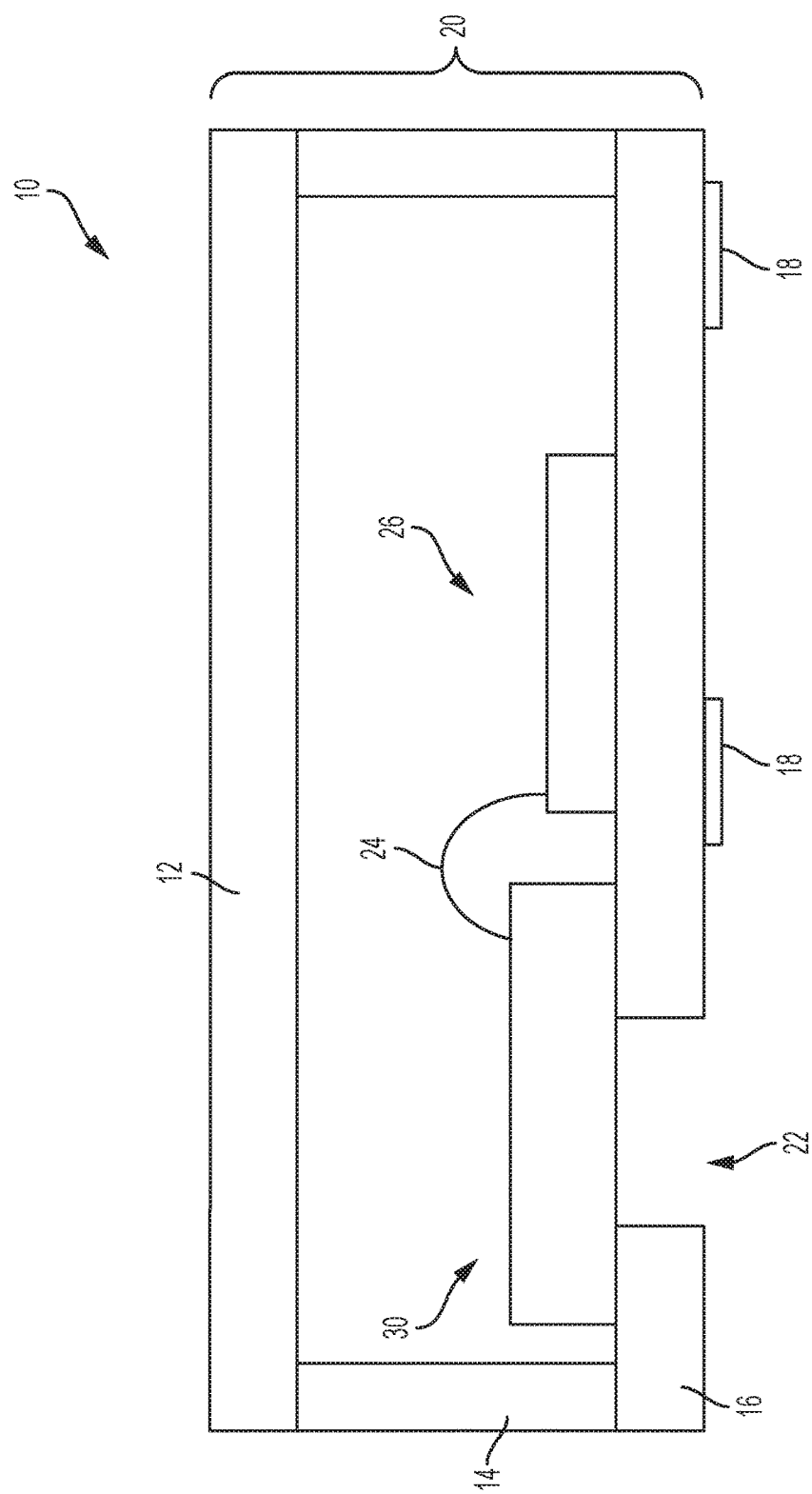
FIG. 2B is a cross-sectional view of another microphone system of FIG. 1 with a bottom port in accordance with a described embodiment of the disclosure.

FIGS. 2A-2C illustrate cross-sectional view of the microphone systems 10 of FIG. 1 having at least one opening 22 formed on various location of the packaging housing 20 in accordance with a described embodiment of the disclosure. The microphone system 10 includes a sensor device/die 30 and a component 26 mounted within any location of the package housing 20. An opening 22 formed on any location of the package housing 20 that is adjacent to at least one of the sensor device 30 or the component 26 to receive attributes or stimuli from external environment. A connection link 24 may be introduced to communicatively couple the sensor device 30 to the component 26. The connection link 24 may be wire bonding, solder-bump, solder microbump, solder ball, or any suitable connectors. In some embodiments, the connection link 24 may be a wireless communication link and the sensor device 30 is communicatively coupled to the component 26 with built-in interfaces formed in both sensor device 30 and the component 26. The wireless communicative link, for example, may be WiFi, near field communication (NFC), Zigbee, Smart WiFi, Bluetooth (BT), Qi wireless communication, ultra-wide band (UWB), cellular protocol frequency, radio frequency, or any suitable communication link. Depending on the applications, any number of sensor devices 30, components 26, or connection links 24 between the sensor devices and the components may be used. Although side-by-side configuration of the component 26 and the sensor device 30 is illustrated in FIG. 1, any suitable configurations may be possible. For example, the sensor device 30 may be placed or mounted on top of the component 26 to form a stacked configuration. In another example, an optional hole is formed within the component 26 and is configured to receive the sensor device 30 and surround the sensor device 30.

Figure 3B:
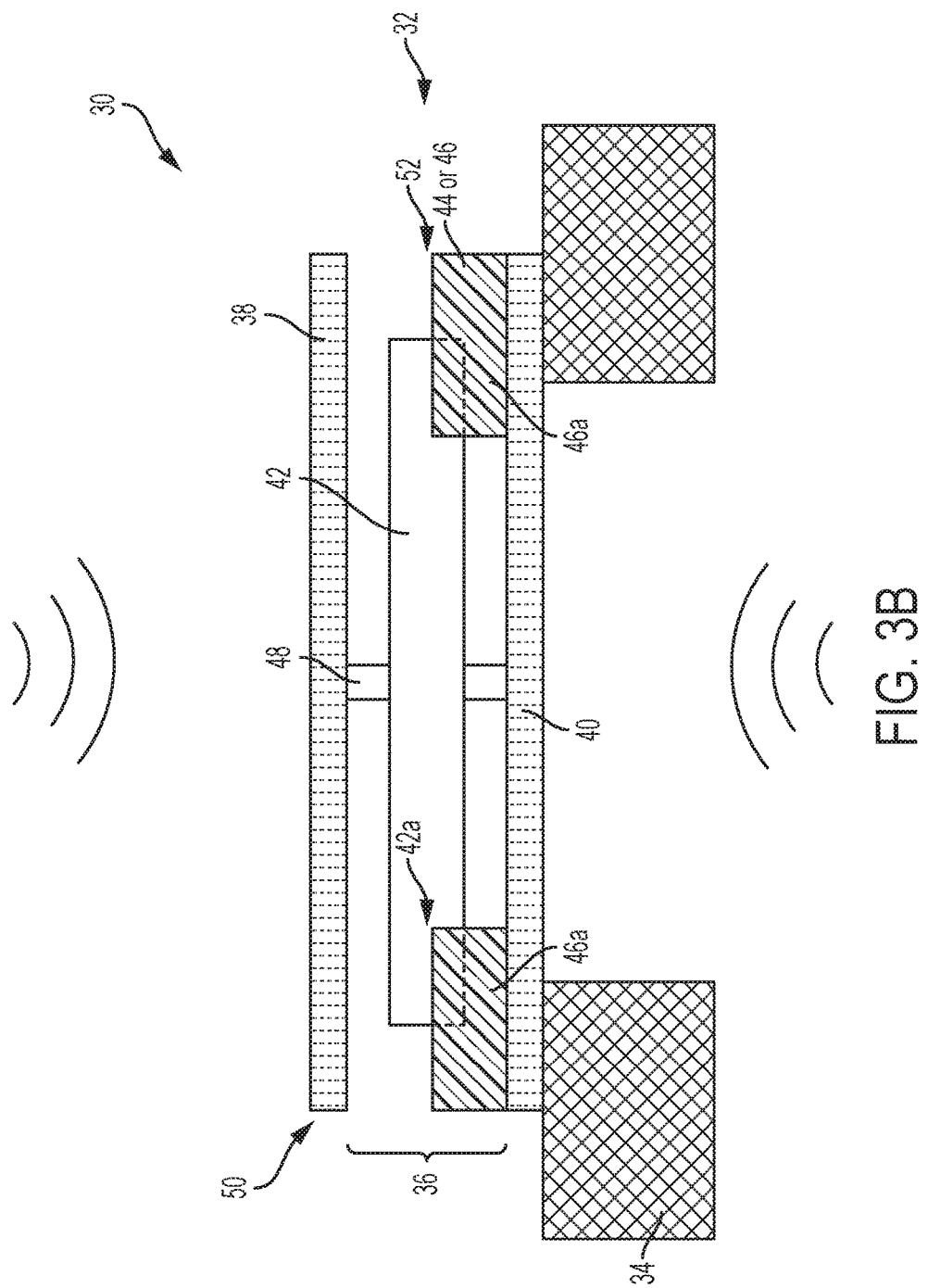
Figure 3C:
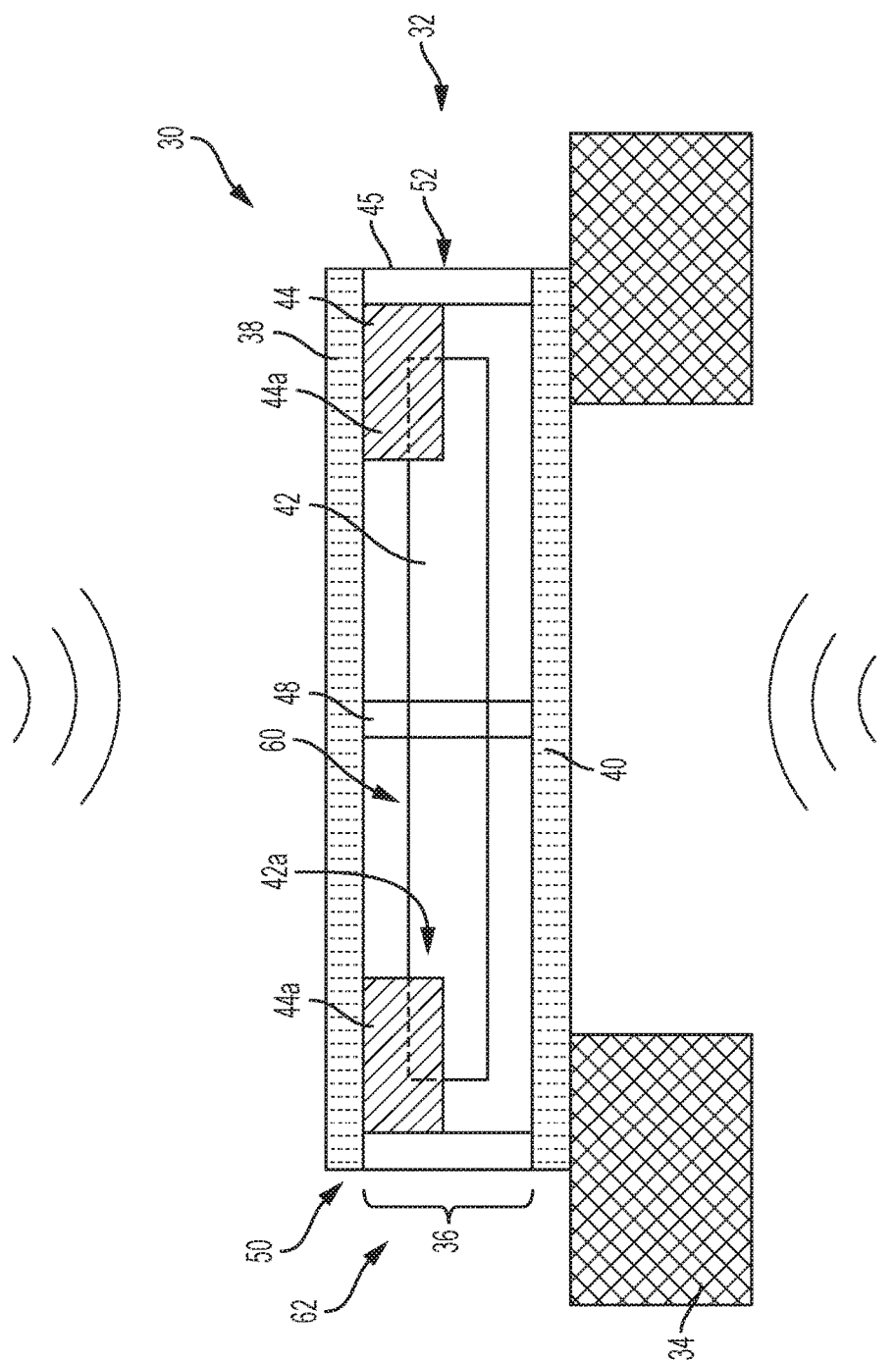
Figure 3D:
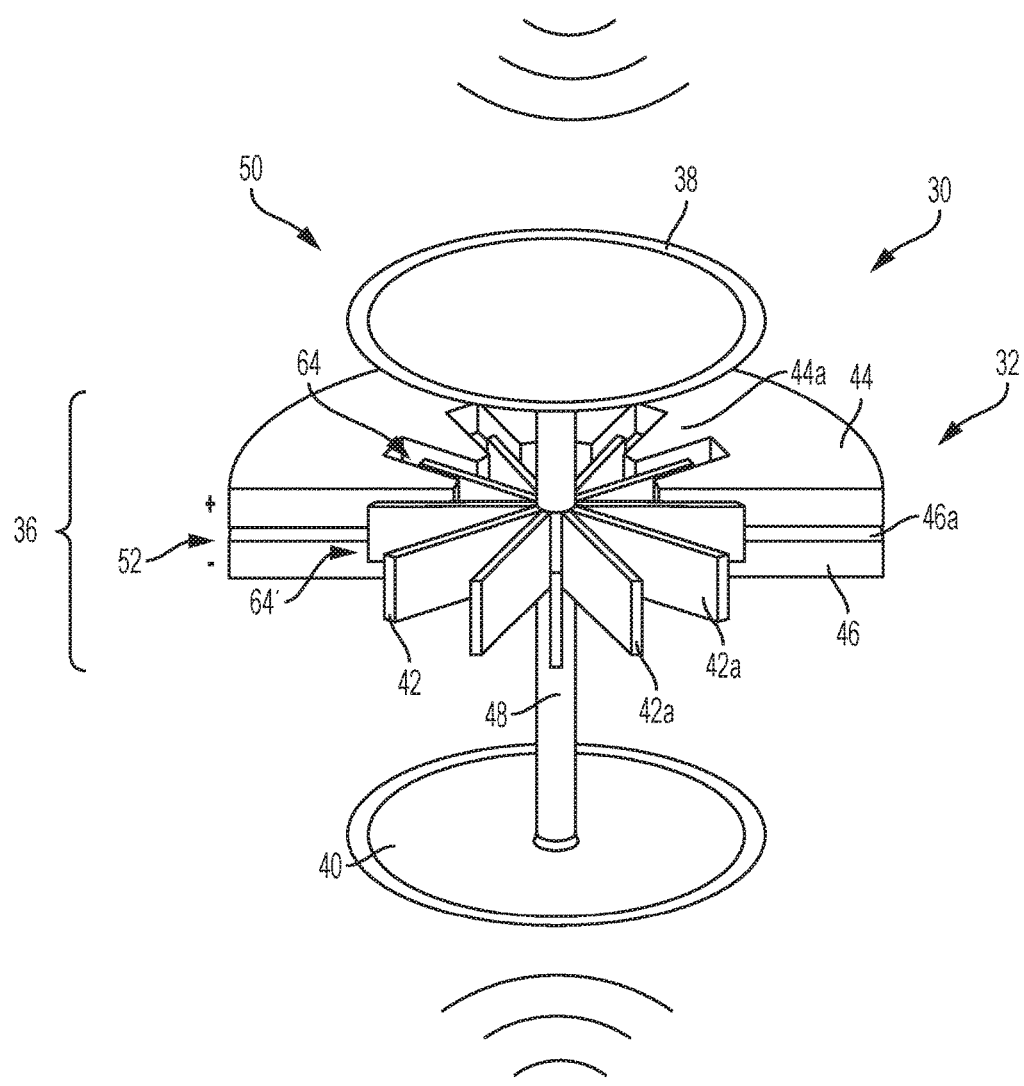
Figure 3E:
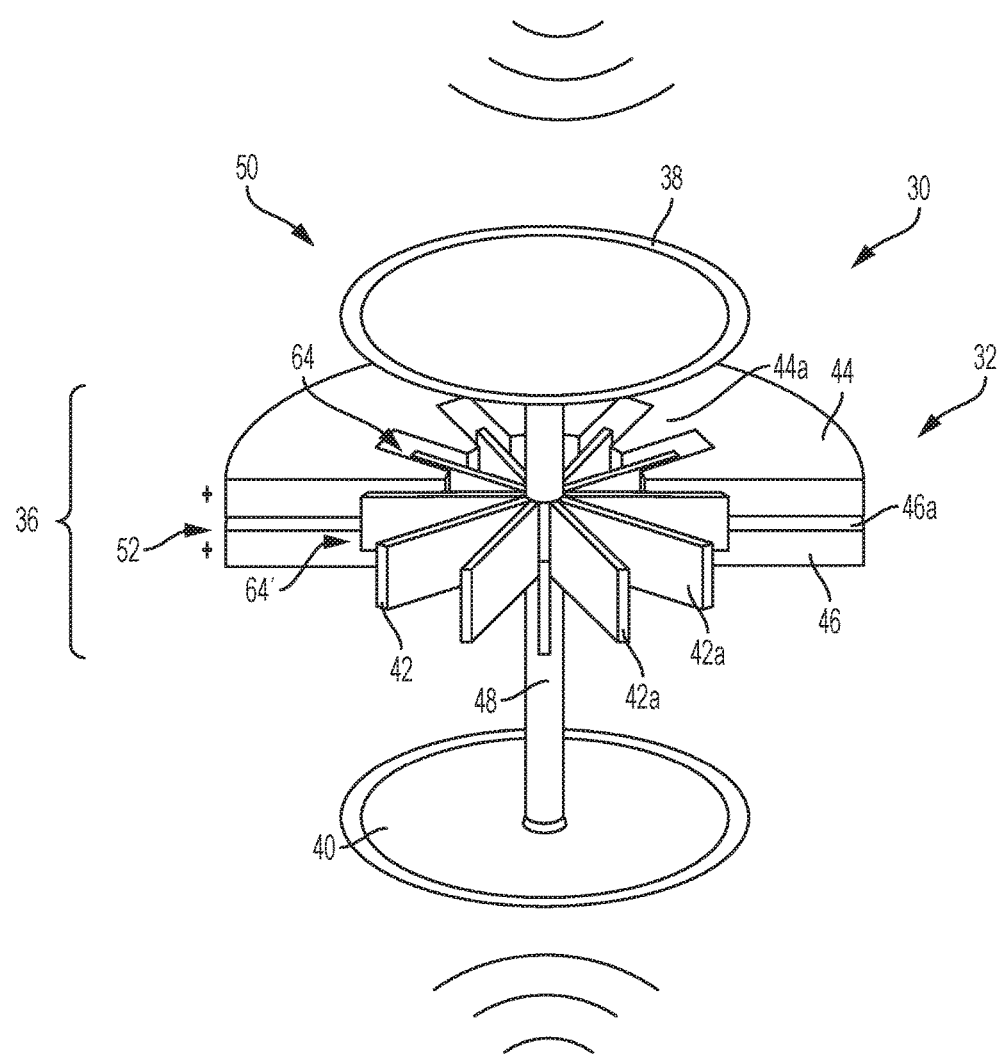

FIG. 3A-3I illustrate views of a microphone die 30 mounted within the microphone system 10 of FIG. 1 in accordance with various embodiments of the disclosure. The microphone die 30 includes a driving system 32 mounted on a base unit 34, such as a substrate. Within the driving system 32 includes an electrode assembly 50 and a comb finger counter electrode assembly 36 insulated from the electrode assembly 50. In one embodiment, the electrode assembly 50 is a movable electrode member assembly such as a diaphragm and the comb finger counter electrode assembly 36 is a combo diaphragm and back plate comb finger counter electrode assembly. The diaphragm electrode assembly 50 includes a top diaphragm 38 and a bottom diaphragm 40 spaced apart from the top diaphragm 38. Although two diaphragms 38, 40 are illustrated, any number of the diaphragms 38, 40 may be removed or added to the microphone die 30 without scarifying the performance of the microphone die 30. Between the top and bottom diaphragms 38, 40 is the comb finger counter electrode assembly 36 and includes a top comb finger counter electrode element 44, a bottom comb finger counter electrode element 46, and an intermediate comb finger counter electrode element 42. An electrostatic gap 64 separates the intermediate comb finger counter electrode element 42 from top comb finger counter electrode element 44 is provided. An electrostatic gap 64' separates the intermediate comb finger counter electrode element 42 from bottom comb finger counter electrode element 46 is provided. In some embodiments, only one outer comb finger counter electrode element is provided. The top comb finger counter electrode element 44 and the bottom comb finger counter electrode element 46 may also be referred to as top stationary electrode member 44 and bottom stationary electrode member 46. The intermediate comb finger counter electrode element 42 may or may not be referred to as moving electrode member 42. As illustrated in FIG. 3B, a bottom comb finger counter electrode element 46 defines as the outer comb finger counter electrode element is provided. In another embodiment such as the microphone illustrated in FIG. 3C, a top comb finger counter electrode element 44 defines as the outer comb finger counter electrode element is provided. A gap 52 separates the top and bottom comb finger counter electrode elements 44, 46 is provided. In some embodiments, the top and bottom comb finger counter electrode elements 44, 46 are insulated from each other by depositing any suitable materials that acts as an insulator on one surface of the comb finger counter electrode elements 44, 46. To insulate the comb finger counter electrode elements 44, 46, only a portion of the surface of at least one of the comb finger counter electrode elements 44, 46 is covered with the insulating material. However, the entire surface of at least one of the comb finger counter electrode elements 44, 46 can also be covered with an insulating material or film. In another embodiment, an insulating layer or film may be introduced as a separate layer or film and is disposed between the comb finger counter electrode elements 44, 46. In some embodiments, the gap 52 is not required in the microphone die 30 to separate and isolate the comb finger counter electrode elements 44, 46 once an insulating material is introduced between the comb finger counter electrode elements 44, 46. To the certain extend, the gap 52 may still exist between the comb finger counter electrode elements 44, 46 where the insulating material is present from the microphone die 30 at the peripheral edge of the comb finger counter electrode elements 44, 46.

Each of the comb finger counter electrode elements 42, 44, 46 includes comb finger structures 42a, 44a, 46a having a series of comb fingers patterned out from a portion of the comb finger counter electrode elements 42, 44, 46, respectively. The comb finger structures 44a, 46a project from the portion of the comb finger counter electrode elements 44, 46 and extend toward the comb finger counter electrode element 42. Similarly, the comb finger structure 42a of the comb finger counter electrode element 42 projects from the portion of the comb finger counter electrode element 42 and extends toward the comb finger counter electrode elements 44, 46. A top portion of the comb finger structure 42a is surrounded by comb finger structure 44a and a bottom portion of the comb finger structure 42a is surrounded by comb finger structure 46a. MEMS sensor with various polarity configurations may be introduced for several reasons. In one embodiment, a MEMS sensor includes a polarity configuration with different potential for biasing top and bottom electrode elements 44, 46. In another embodiment, a MEMS sensor includes a polarity configuration having different or opposite polarity and is configured to collect noise signal while the signals produced by top and bottom electrode elements 44, 46 either cancelled out, combining the resulted signal value received from the top and bottom electrode elements 44, 46, or subtracting the resulted signal value received from top and bottom electrode elements 44, 46. In yet another embodiment, a MEMS sensor includes a polarity configuration having identical polarity and is configured to readout signal produced by the top and bottom electrode elements 44, 46. In further yet another embodiment, a MEMS sensor includes an alternating polarity configuration with either identical or different/opposite polarity to perform at least one of the above-described functions. Between the comb finger of the comb finger structures 42a and the comb finger of at least one of the comb finger structures 44a, 44a is a gap 52 for insulation purpose as they are at different potentials. While the comb finger structures 42a, 44a, 46a of the comb finger counter electrode elements 42, 44, 46 have equal length and equal width, the length of the comb finger structures 42a, 44a, 46a of comb fingers counter electrode element 42 may varies from the length of the comb finger structures 42a, 44a, 46a of comb finger counter electrode elements 44, 46. Which is to say, the measurement of the comb fingers of the comb finger counter electrode elements 42, 44, 46 may be selected for the purpose of the application. The configuration and geometry of the comb fingers of the comb finger counter electrode elements 42, 44, 46 may various, depending on the application. Although the comb finger counter electrode assembly 36 formed a hexagon shape as depicted in FIG. 3I, other geometry in various measurements may be used without departing from the spirit of the disclosure.

A connecting member 48 coupled the intermediate comb finger counter electrode element 42 to the first and second diaphragms 38, 40 is illustrated in FIGS. 3A-3E and 3G-3I. In one embodiment, the connecting member 48 can be fabricated as part of the intermediate comb finger counter electrode element 42 wherein the connecting member 48 includes a top portion and a bottom portion. The top portion connecting member extends upward from a top surface of the intermediate comb finger counter electrode element 42 toward and connects to the top diaphragm 38. The bottom portion connecting member extends downward from a bottom surface of the intermediate comb finger counter electrode element 42 toward and connects to the bottom diaphragm 40. In another embodiment, the connecting member can be fabricated as part of the first and second diaphragms 38, 40 wherein a top connecting member extends downward from the top diaphragm 38 toward and connects to the intermediate comb finger counter electrode element 42 and a bottom connecting member extends upward from the bottom diaphragm 40 toward and connects to the intermediate comb finger counter electrode element 38. In yet another embodiment, the connecting member 48 comprises a top connecting member and a bottom connecting member. Each member includes first and second ends. The first end of the top connecting member is attached to the inner surface of the top diaphragm 38 and the second end of the top connecting member is attached to a top surface of the intermediate comb finger counter electrode element 42. The first end of the bottom top connecting member is attached to the inner surface of the bottom diaphragm 40 and the second end of the top connecting member is attached to a bottom surface of the intermediate comb finger counter electrode element 42.

Figure 3F:
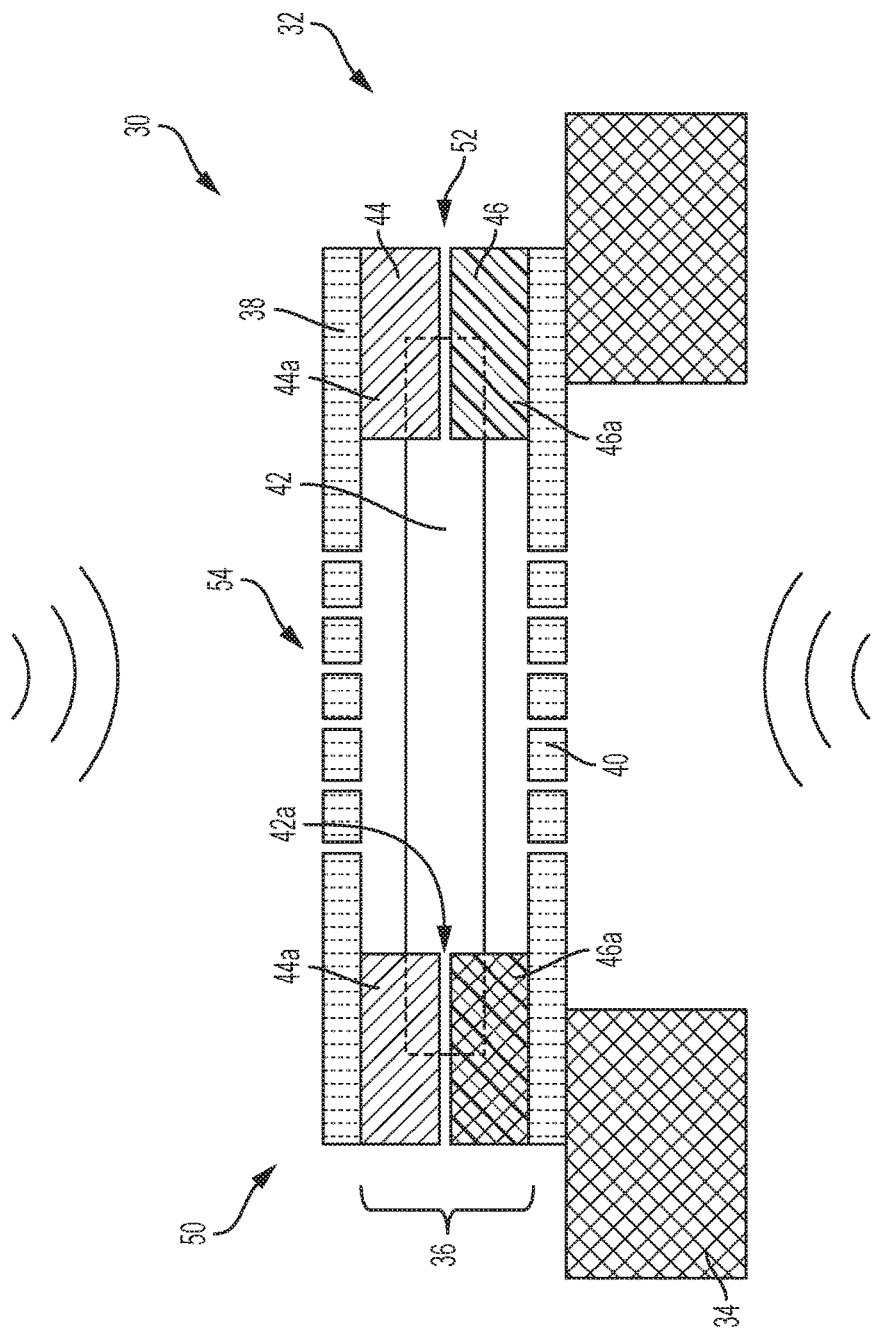
Figure 3G:
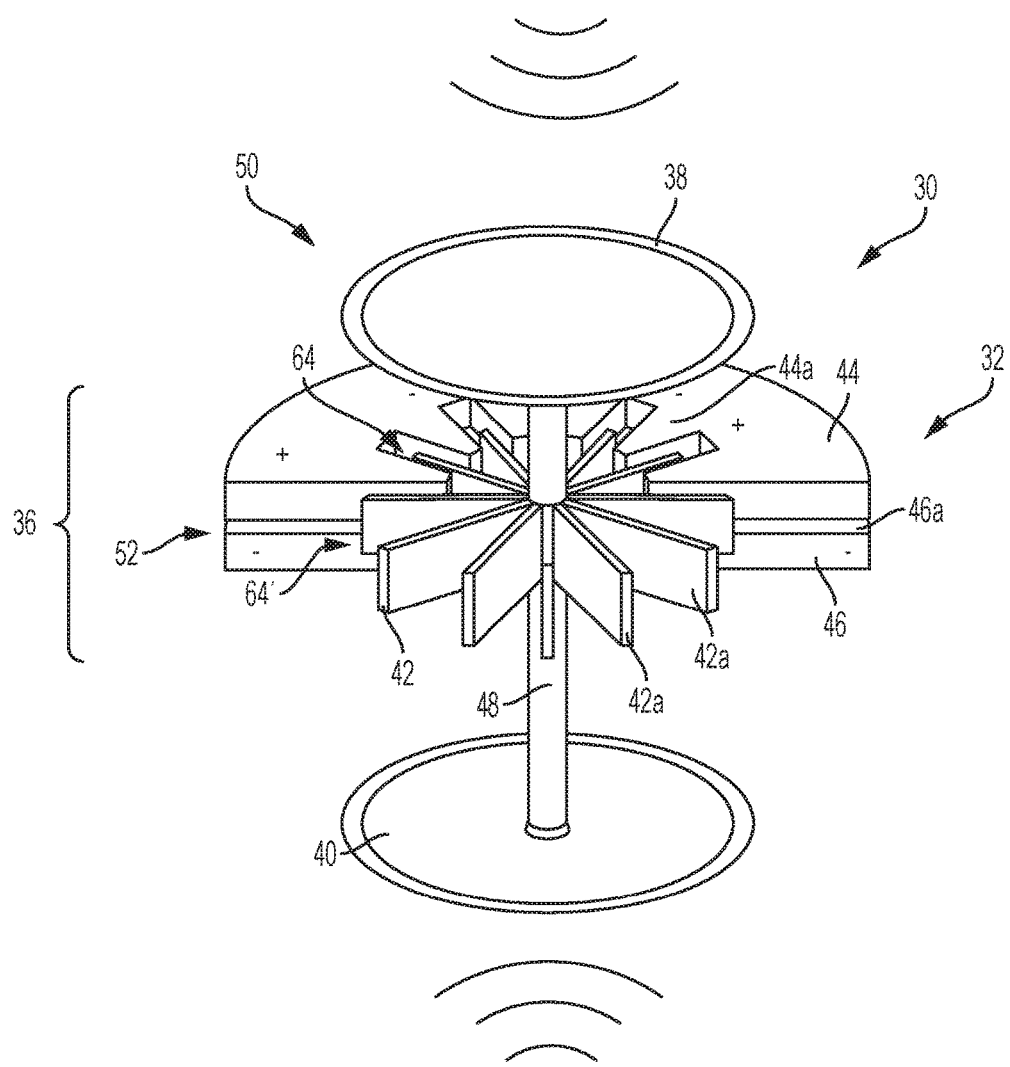
Figure 3H:
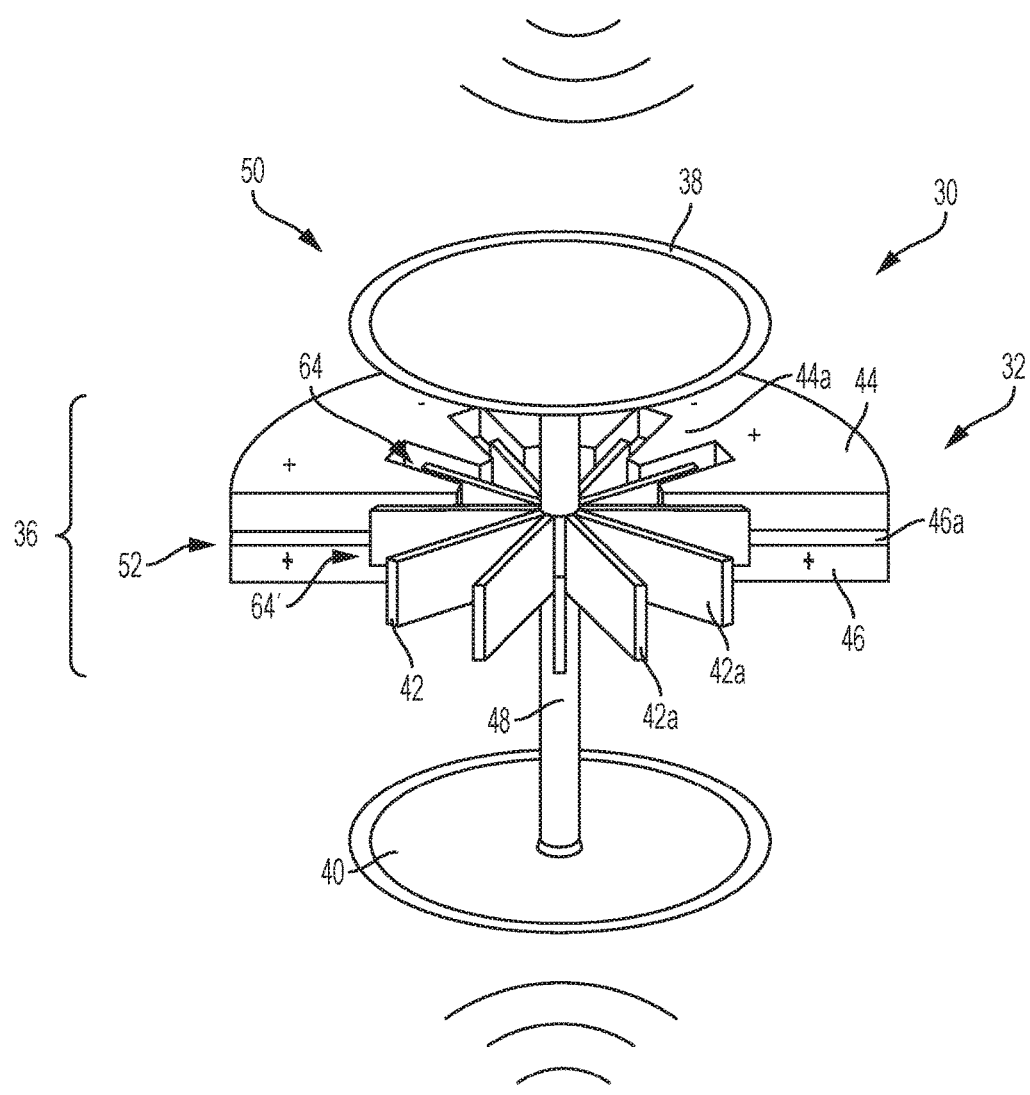
Figure 3I:
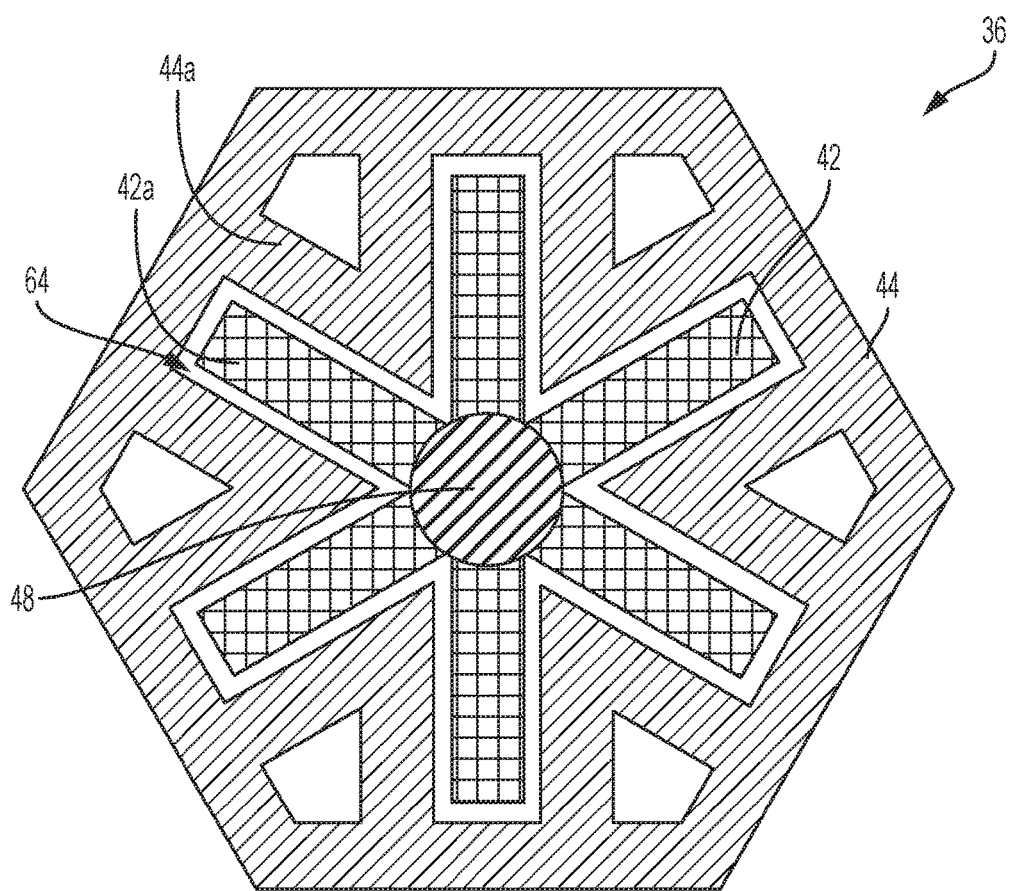

Unlike from FIGS. 3A-3E and 3G-3I, the microphone die 30 of FIG. 3F does not require a connecting member. Dielectric assembly 50 functions as a barrier having openings 54 formed in the dielectric assembly to receive sound waves whereas the comb finger counter electrode assembly 36 functions as a diaphragm comb finger counter electrode assembly.

Now returning to FIG. 3C, the rigid wall 45 couples the top electrode member 38 to the bottom electrode member 40 which form an inner region or an electrode region 60, collectively. Such formation separates the inner region 60 from an outer or an ambient region 62 that is located outside the driving system 32. In doing so, a sealed cavity defined by the inside region 60 is formed.

In one embodiment, the inner region 60 and the outer region 62 are gas pervious and debris impervious by using a gas pervious and debris impervious material to form 38, 40, or 45. The material for example includes a porosity which allows gas to flow easily/freely within the regions 60, 62 while blocking or preventing debris penetration. Pressure in the inner region 60 is substantially the same as the pressure in the outer region 62.

In another embodiment, the inner region 60 and the outer region 62 are gas impervious and debris impervious by using a material that is gas impervious and debris impervious for 38 and 40 and 45. The pressure in the inner region 60 may be substantially the same as or different from the outer region 62. For example, the pressure in the inner region 60 can be higher or lower than the pressure in the outer region 62. Depending on the surroundings, the pressure in the electrode region 60 and the ambient region 62 may be substantially the same, above, or lower than an atmospheric pressure. In some other surroundings, the pressure in the electrode region 60 may be lower than the pressure in the ambient region 62, whilst the pressure in both regions 60, 62 may be lower or higher than the atmospheric pressure. In yet another surrounding, the pressure in the electrode region 60 may be higher than the pressure in the ambient region 62, whilst the pressure in both regions 60, 62 may be lower or higher than the atmospheric pressure.

The driving system 32 is assembled in a closed chamber with a defined atmosphere. The defined atmosphere includes certain mixture of gasses at a certain pressure and temperature. The gas may be monatomic gas or diatomic gas. For example, the gas is helium, neon, argon, krypton, xenon, radon, hydrogen, oxygen, nitrogen, carbon monoxide. In some example, the gas may have a low viscosity such as methane, ethane, and ammonia. At least one or more combined gaseous substances or gas may be introduced during the assembly stage. Within the electrode region 60, after the assembly is completed, a defined state of the gas is encapsulated. The pressure of the gas found in the electrode region 60 can be between 0.0001-1.1 bar, between 0.001-0.05 bar, below 0.0001 bar, above 0.05 bar, for instance. Now the defined state of the gas having a pressure of the described range is introduced in the electrode region 60, the artifact noise is significantly reduced which then improves the acoustic signal produced by the driving system 32.

The driving system 32 may be formed from a material such as silicon, silicon nitride, silicon carbide, silicon oxide, grapheme, dielectric, polymer, metal or any other suitable material. In one embodiment the diaphragms 38 and 40 are substantially made of a low conductive material or insulating material (e.g. 1-1E18 Ohm*cm) such as e.g. silicon nitride, the rigid wall 45 is substantially made of a low conductive material or insulating material such as e.g. silicon dioxide or silicon nitride, the connecting member 48 is substantially made of a low conductive material or insulating material such as e.g. silicon dioxide or silicon nitride, the comb finger counter electrode elements 42, 44, and 44a are substantially made of a conductive material such as e.g. silicon or doped silicon, the base 34 is substantially made of a conductive material or semi-conductive material or low conductive material or insulating material such as e.g. silicon or silicon dioxide.

In one embodiment the diaphragms 38 and 40 are substantially made of or contain a material having a tensile stress or a tensile residual stress of e.g. 0.1-2000 MPa, or 0.1-10 MPa, or 10-50 MPa, or 50-100 MPa, or 100-300 MPa, or 300-2000 MPa. In one embodiment the diaphragms 38 and 40 are substantially made of low stress nitride (LSN) having a tensile residual stress of 1-100 MPa. In one embodiment the thickness of the diaphragms 38 and 40 is in the range of 0.1-5 micrometer. In on embodiment the diaphragms 38 and 40 and the connecting element 48 contain runners made of conductive material to electrically contact the comb finger counter electrode 42 to a bond pad at the periphery of the MEMS chip.

When the sound waves passes through the opening 22 of the microphone system 10 of FIGS. 1 and 2A-2C, the sound waves impinge on the driving system 32 causes the driving system 32 to flex, i.e. vibrate up and down. Such movement of the driving system 32 creates a change in the amount of area of overlap between the electrodes which is translated into a change in capacitance which is translated into an electrical signal by the component 26, i.e. ASIC. The ASIC then measures the at least one of voltage/charge/current variations caused when the capacitance changes due to the motion of the driving system 32 in response to sound waves In the microphone 30 of FIGS. 3A-3E and 3G-3I, the sound waves impinge on one of the diaphragms 38, 40 to vibrate up and down in response to the change in air pressure caused by the sound waves. The movement of one of the diaphragms 38, 40 in turn cause a movement of the intermediate comb finger counter electrode element 42 via the connecting member 48. Such movement of the intermediate comb finger counter electrode element 42 creates a change in the area of overlap between the electrodes which is translated into a change in the amount of capacitance between the comb fingers of the intermediate comb finger counter electrode element 42 and the comb fingers of the top and bottom comb finger counter electrode elements 44, 46 which is translated into an electrical signal.

In the microphone 30 of FIG. 3F, the sound waves pass through the openings 50 of one of the top back plates 38, 40 and impinge on the intermediate diaphragm comb finger counter electrode element 42 which in turn vibrates up and down in response to the change in air pressure caused by the sound waves. The movement of intermediate diaphragm comb finger counter electrode element 42 creates a change in the amount of capacitance between the comb fingers of the intermediate comb finger counter electrode element 48 and the comb fingers of the top and bottom comb finger counter electrode elements 44, 46 which is translated into an electrical signal.

Figure 4:
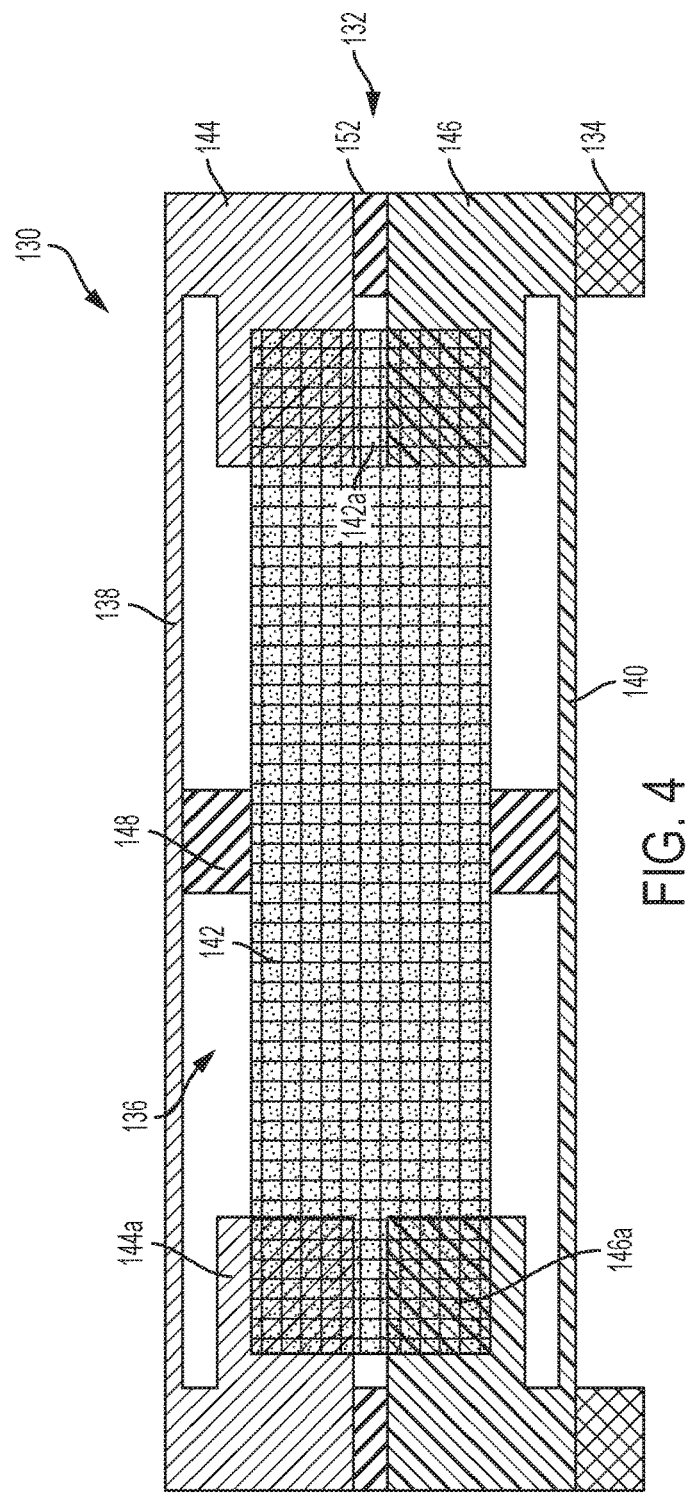
FIG. 4 is a cross-sectional view of a driving system in accordance with a described embodiment of the disclosure.

FIG. 4 is a cross-sectional view of a driving system 132 in accordance with various embodiment of the disclosure. Unlike from the driving system 32 of FIG. 3A, the top and bottom comb finger counter electrode elements 144, 146 are integrated and formed as a portion of the top and bottom diaphragm 138, 140, respectively. As can be seen, the top comb finger counter electrode element 144 and the top diaphragm 138 formed a C shape. Similarly, the bottom comb finger counter electrode element 146 and the bottom diaphragm 140 formed an inverted C shape. Each of the top and bottom finger counter electrode elements 144, 146 include a series of comb fingers 144a, 146a project from the body of the top and bottom comb finger counter electrode element 144, 146 toward the intermediate comb finger counter electrode element 142. Between the top and bottom comb finger counter electrode element 144, 146 is either a gap 152, an insulating layer, or a combination thereof. As illustrated, an insulating layer 156 is formed between the top and bottom comb finger counter electrode element 144, 146 to restrict the movement at the edge of the top and bottom diaphragm 138, 140 caused by the sound waves.

As the sound waves impinge on one of the diaphragms 138, 140, except the edge of one of the diaphragm 138, 140 in a non-movement motion, the center of one of the diaphragms 138, 140 vibrates up and down in response to the change in air pressure caused by the sound waves. The movement of one of the diaphragms 138, 140 in turn cause a movement of the intermediate comb finger counter electrode element 142 via the connecting member 148. Such movement of the intermediate comb finger counter electrode element 142 creates a change in the amount of capacitance between the comb fingers 142a of the intermediate comb finger counter electrode element 142 and the comb fingers of the top and bottom comb finger counter electrode elements 144, 146 which is translated into an electrical signal.

Figure 5A:
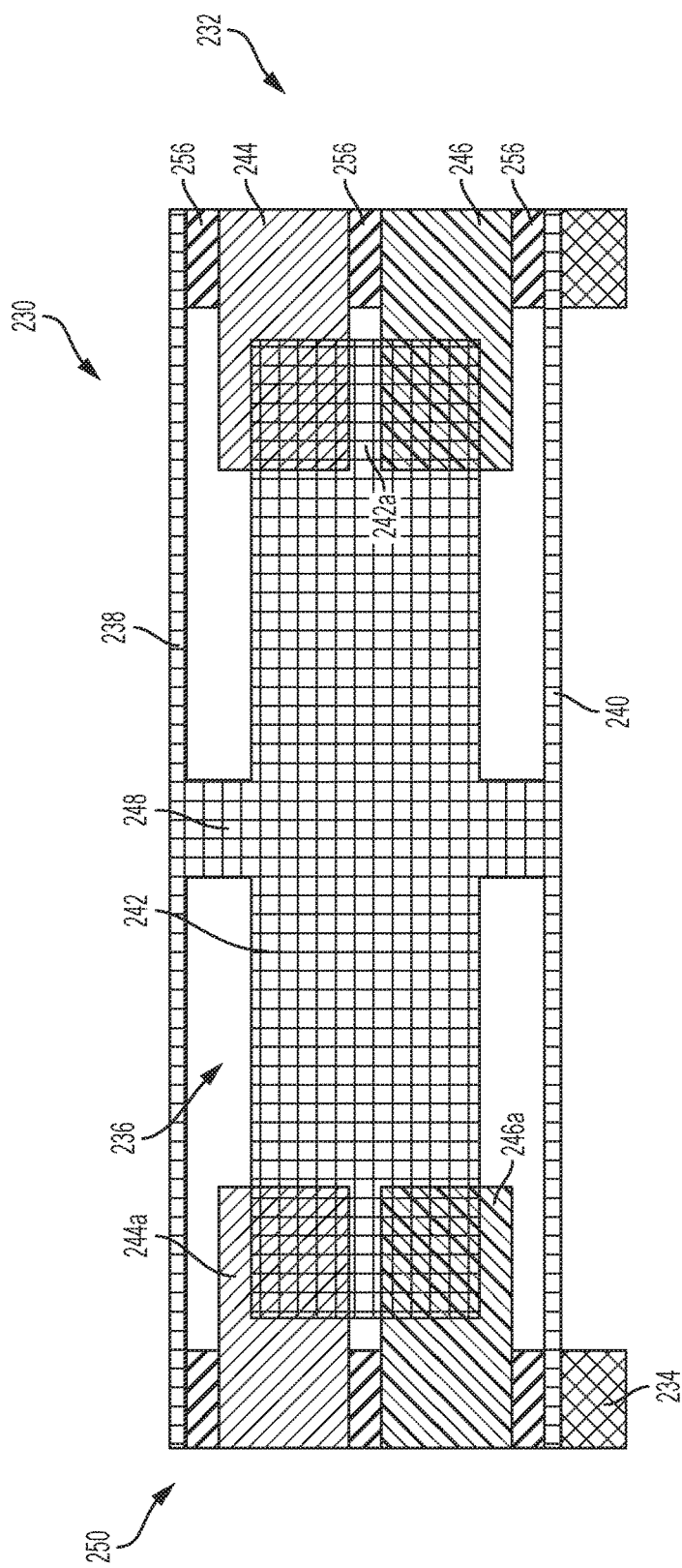
FIGS. 5A and 5B are cross-sectional view of a driving system in accordance with various described embodiments of the disclosure.
Figure 5B:
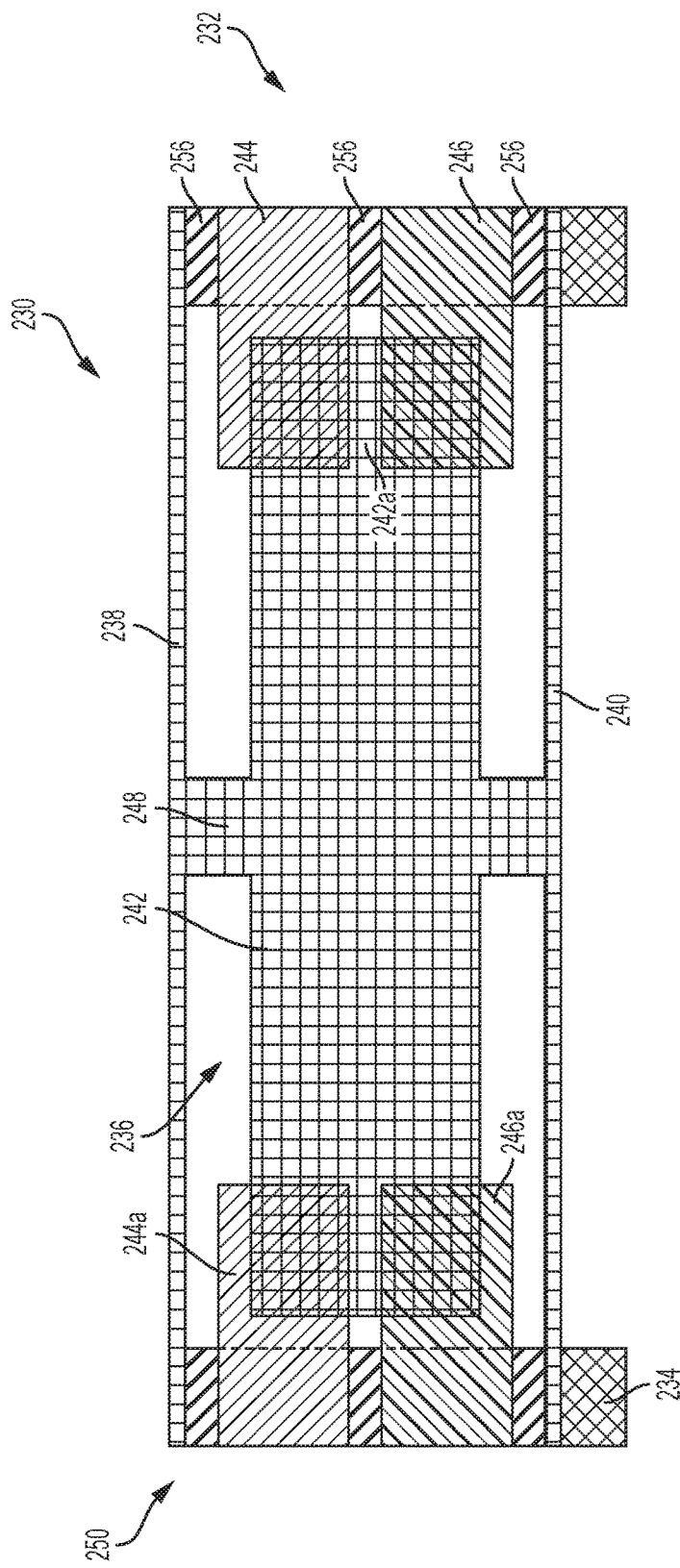

FIGS. 5A and 5B are cross-sectional view of a driving system 232 in accordance with various embodiment of the disclosure. Unlike from the driving system 32 of FIG. 3A, the top and bottom diaphragm 238, 240, the connecting member 248, and the intermediate comb finger counter electrode element 242 are formed as a portion of the as a single assembly. As the sound waves impinge on one of the diaphragms 238, 240, one of the diaphragms 238, 240 vibrates up and down in response to the change in air pressure caused by the sound waves. The movement of one of the diaphragms 238, 240 in turn cause a movement of the intermediate comb finger counter electrode element 242 via the connecting member 248. Such movement of the intermediate comb finger counter electrode element 242 creates a change in the amount of capacitance between the comb fingers of the intermediate comb finger counter electrode element 242 and the comb fingers of the top and bottom comb finger counter electrode elements 244, 246 which is translated into an electrical signal. Now illustrated in FIG. 5B, optional opening O shown as dotted line that is formed on the insulator wall or the rigid wall 256 is configured to receive at least one or more of the comb finger counter electrode elements 244 and 246. In alternate embodiment, an optional cavity O may be formed on the comb finger counter electrode elements 244 and 246 for receiving the rigid wall 256.

FIG. 6 is a cross-sectional view of a driving system 332 in accordance with various embodiment of the disclosure. Unlike from the driving system 32 of FIG. 3A, edges of the top and bottom finger counter electrode elements 344, 346 are insulated with a layer 356. As the sound waves impinge on one of the diaphragms 338, 340, except the edge of top and bottom finger counter electrode elements 344, 346 in a non-movement motion, one of the diaphragms 338, 340 vibrates up and down in response to the change in air pressure caused by the sound waves. The movement of one of the diaphragms 338, 340 in turn cause a movement of the intermediate comb finger counter electrode element 342 via the connecting member 48. Such movement of the intermediate comb finger counter electrode element 342 creates a change in the amount of capacitance between the comb fingers 342a of the intermediate comb finger counter electrode element 342 and the comb fingers 344a, 346a of the top and bottom comb finger counter electrode elements 344, 346 which is translated into an electrical signal.

Figure 7A:
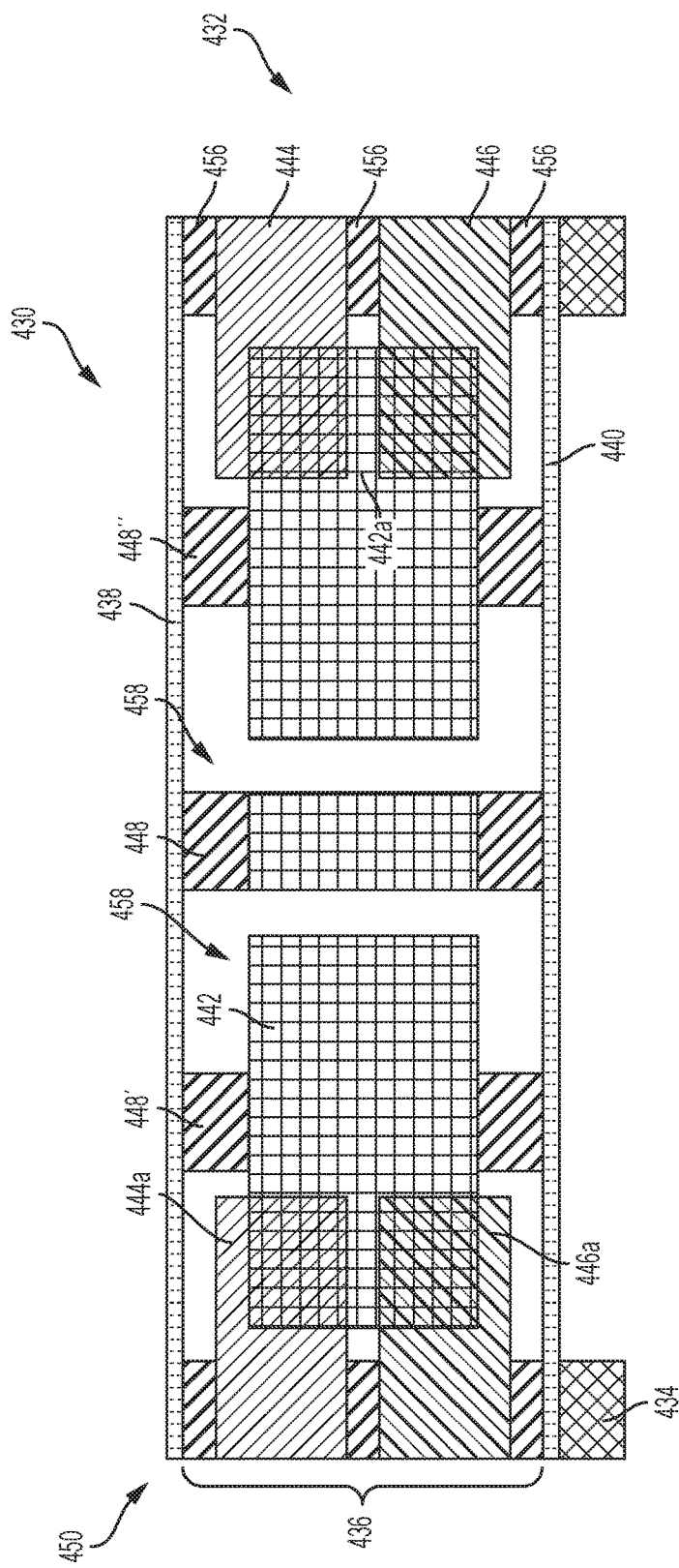
FIGS. 7A-7C are cross-sectional view of a driving system in accordance with various described embodiments of the disclosure.
Figure 7B:
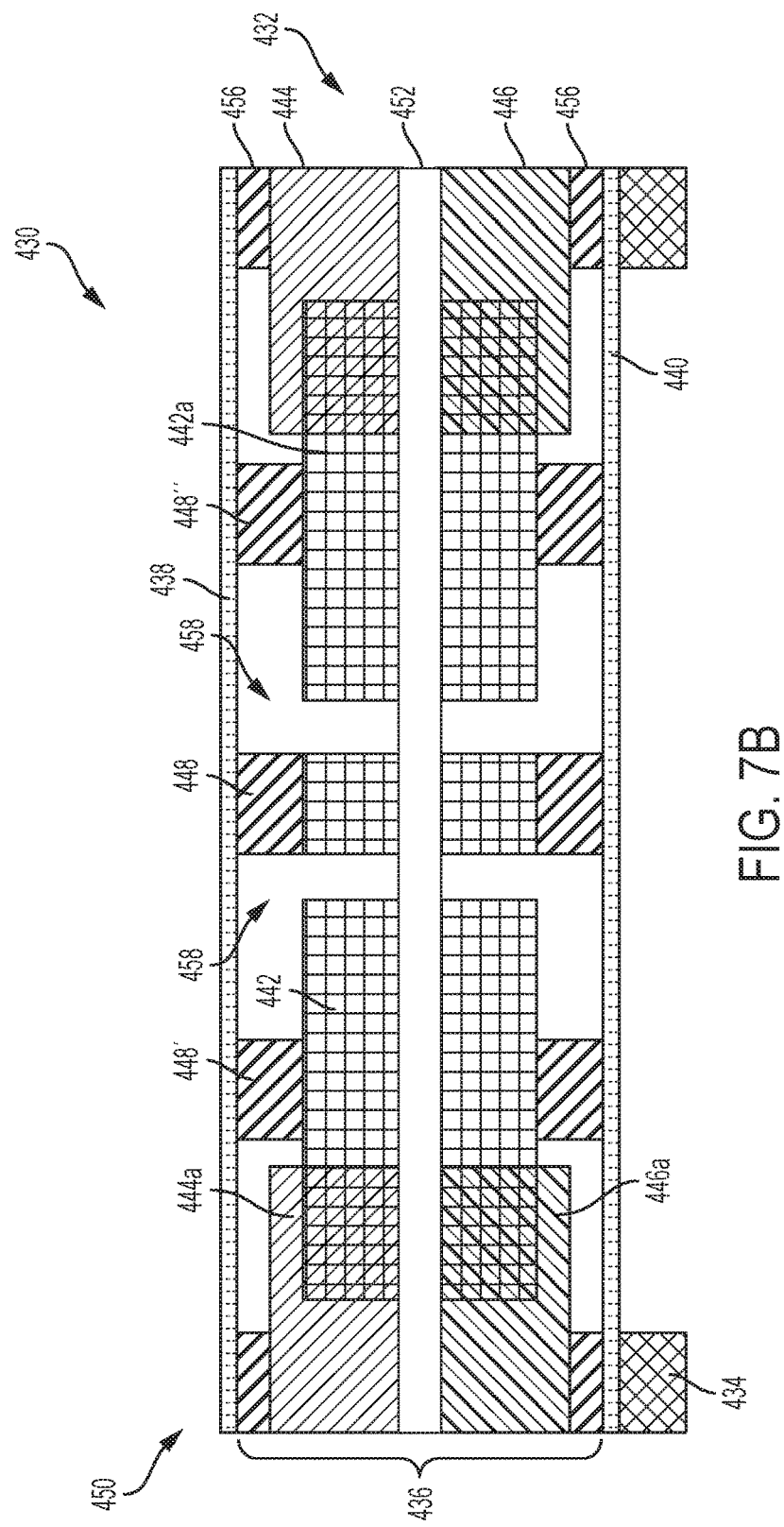
Figure 7C:
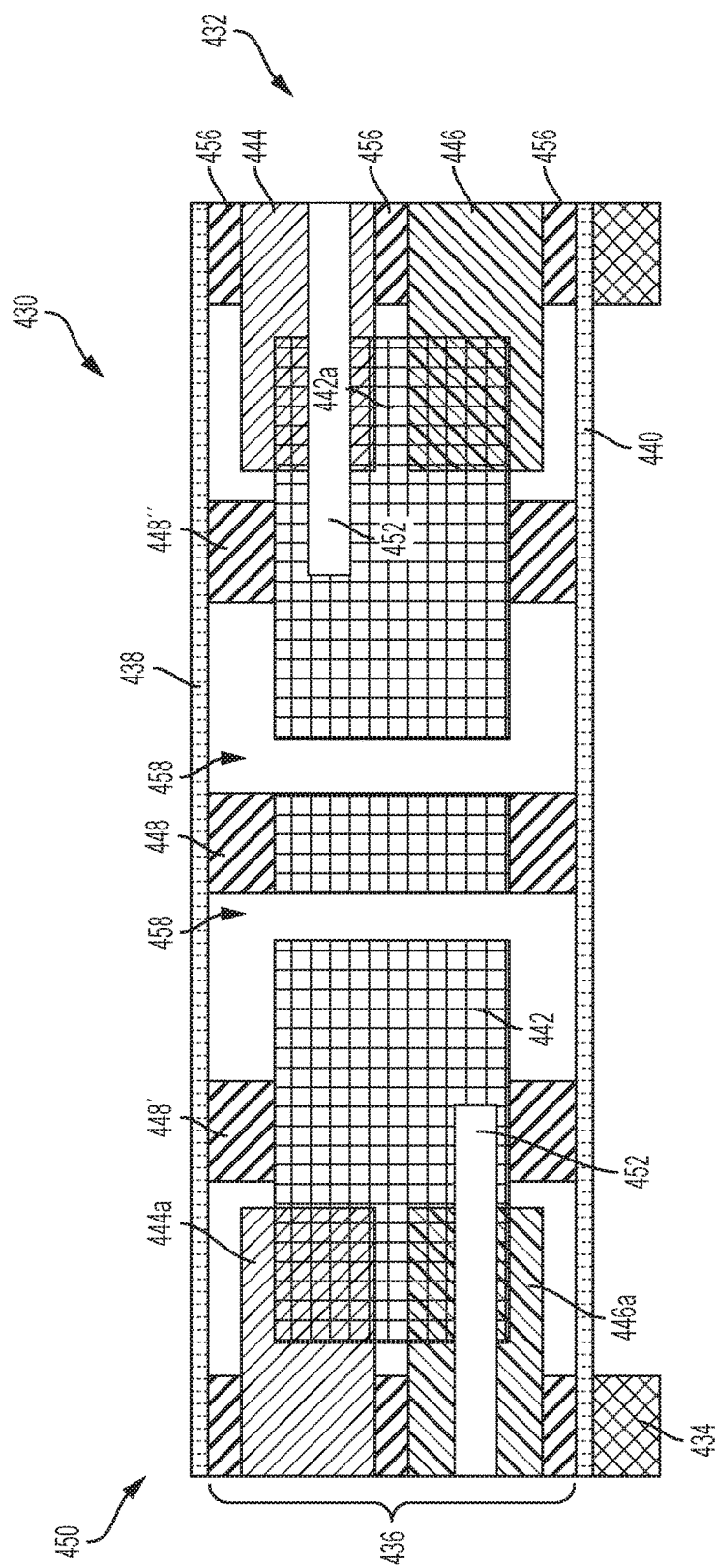

FIGS. 7A-7C are cross-sectional views of various driving systems 432 in accordance with various embodiment of the disclosure. Unlike from the driving system 332 of FIG. 6, openings 458 are optionally formed in the intermediate comb finger counter electrode element 442 in order to form pillar 448. Two additional connecting members 448', 448" coupled the intermediate comb finger counter electrode element 442 to the top and bottom diaphragm 438, 440 are provided. Optional gaps 452 as illustrated in FIGS. 7B and 7C may be formed on any location adjacent to the comb finger electrode element assembly 436 and divides the comb finger electrode element assembly 436 into upper and lower comb finger electrode element assemblies. As the sound waves impinge on one of the diaphragms 438, 440, one of the diaphragms 438, 440 vibrates up and down in response to the change in air pressure caused by the sound waves. The movement of one of the diaphragms 438, 440 in turn cause a movement of the intermediate comb finger counter electrode element 442 via the connecting members 448, 448', and 448". Such movement of the intermediate comb finger counter electrode element 442 creates a change in the amount of capacitance between the comb fingers 442a of the intermediate comb finger counter electrode element 442 and the comb fingers 444a, 446a of the top and bottom comb finger counter electrode elements 444, 446 which is translated into an electrical signal.

Figure 8:
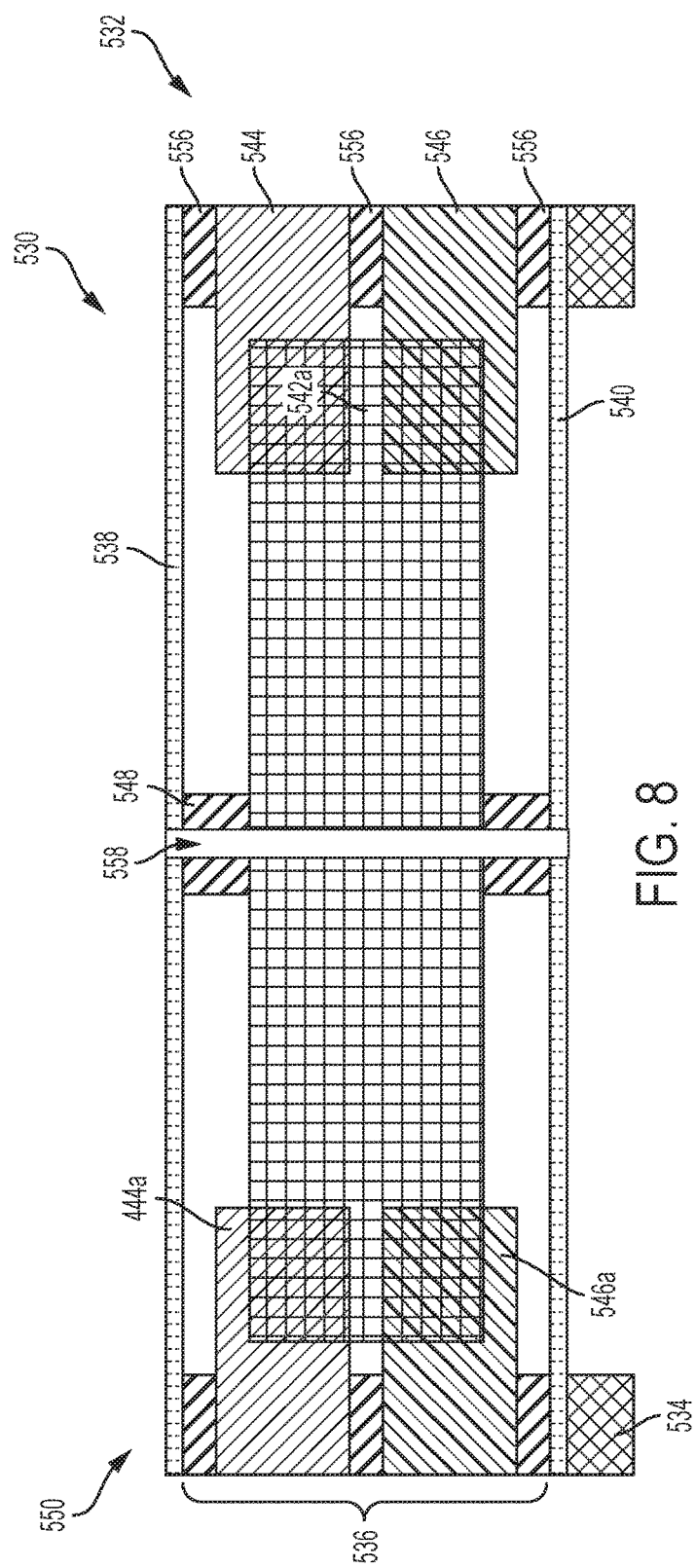
FIG. 8 is a cross-sectional view of a driving system in accordance with a described embodiment of the disclosure.

FIG. 8 is a cross-sectional view of a driving system 532 in accordance with various embodiment of the disclosure. Unlike from the driving system 332 of FIG. 6, a leak hole 558 is formed in the intermediate comb finger counter electrode element 542 to equalize pressure formed in the front and back volumes due to weather changes, elevation, altitude, or any environmental changes. The leak hole 558 may be formed and located within the intermediate comb finger counter electrode element 542. In one embodiment, the leak hole 558 is formed at the center portion or near the center portion of the intermediate comb finger counter electrode element 542. In another embodiment, the leak hole 558 is formed at circumferential portion or near the circumferential portion of the intermediate comb finger counter electrode element 542. More than one leak hole 558 may be formed in the system. Alternatively, a plurality of piercing holes may be formed in the system. As can be seen, both ends of the openings 558 are covered or sealed using the connecting member 548. Opposite ends of the connecting member 548 are in turn coupled to the diaphragms 538, 540. As the sound waves impinge on one of the diaphragms 538, 540, one of the diaphragms 538, 540 vibrates up and down in response to the change in air pressure caused by the sound waves. The movement of one of the diaphragms 538, 540 in turn cause a movement of the intermediate comb finger counter electrode element 542 via the connecting members 548, 548', and 548". Such movement of the intermediate comb finger counter electrode element 542 creates a change in the amount of capacitance between the comb fingers 542a of the intermediate comb finger counter electrode element 542 and the comb fingers 544a, 546a of the top and bottom comb finger counter electrode elements 544, 546 which is translated into an electrical signal.

Figure 9A:
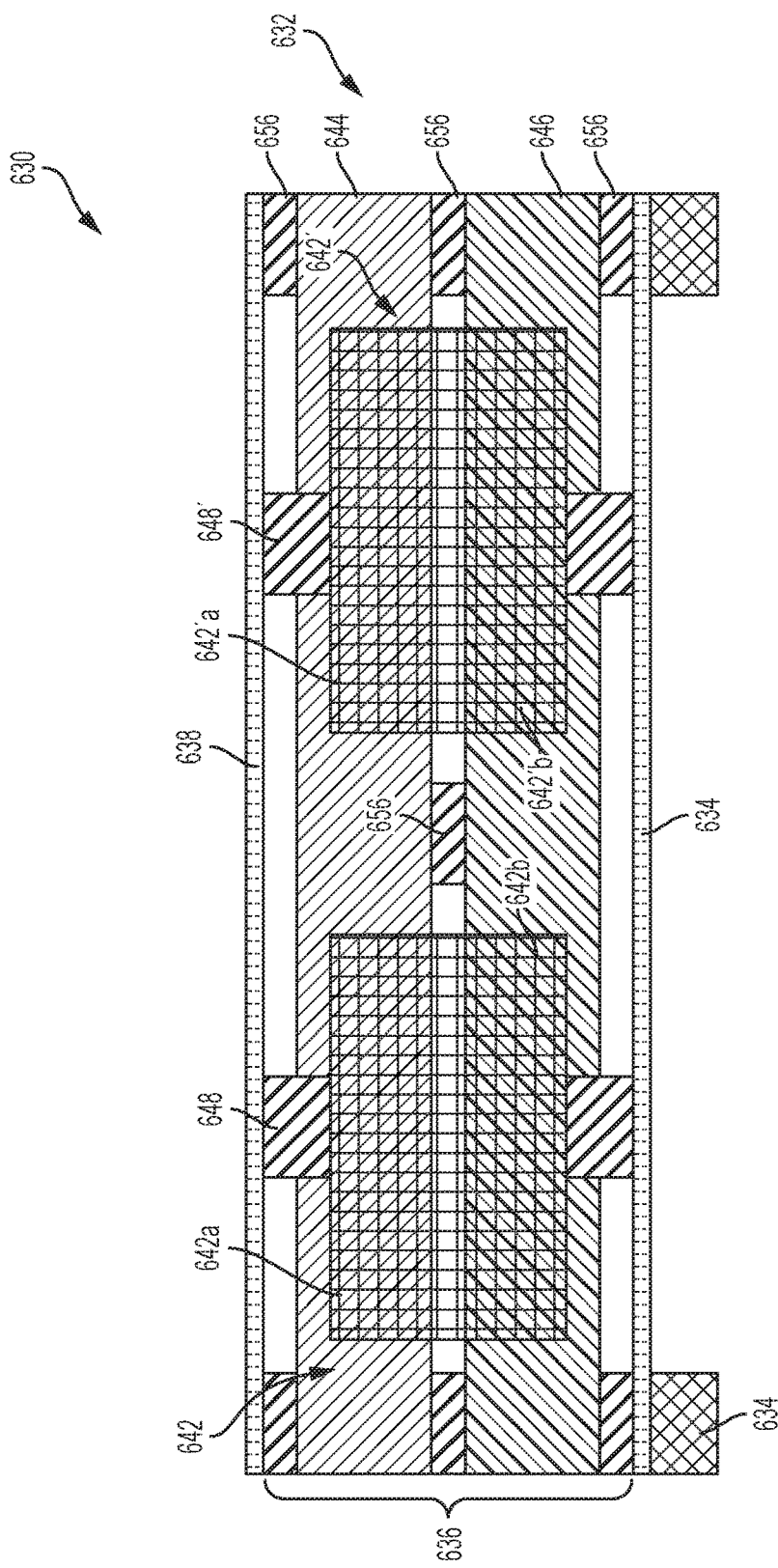
FIGS. 9A and 9B are cross-sectional view of a driving system in accordance with various described embodiments of the disclosure.
Figure 9B:
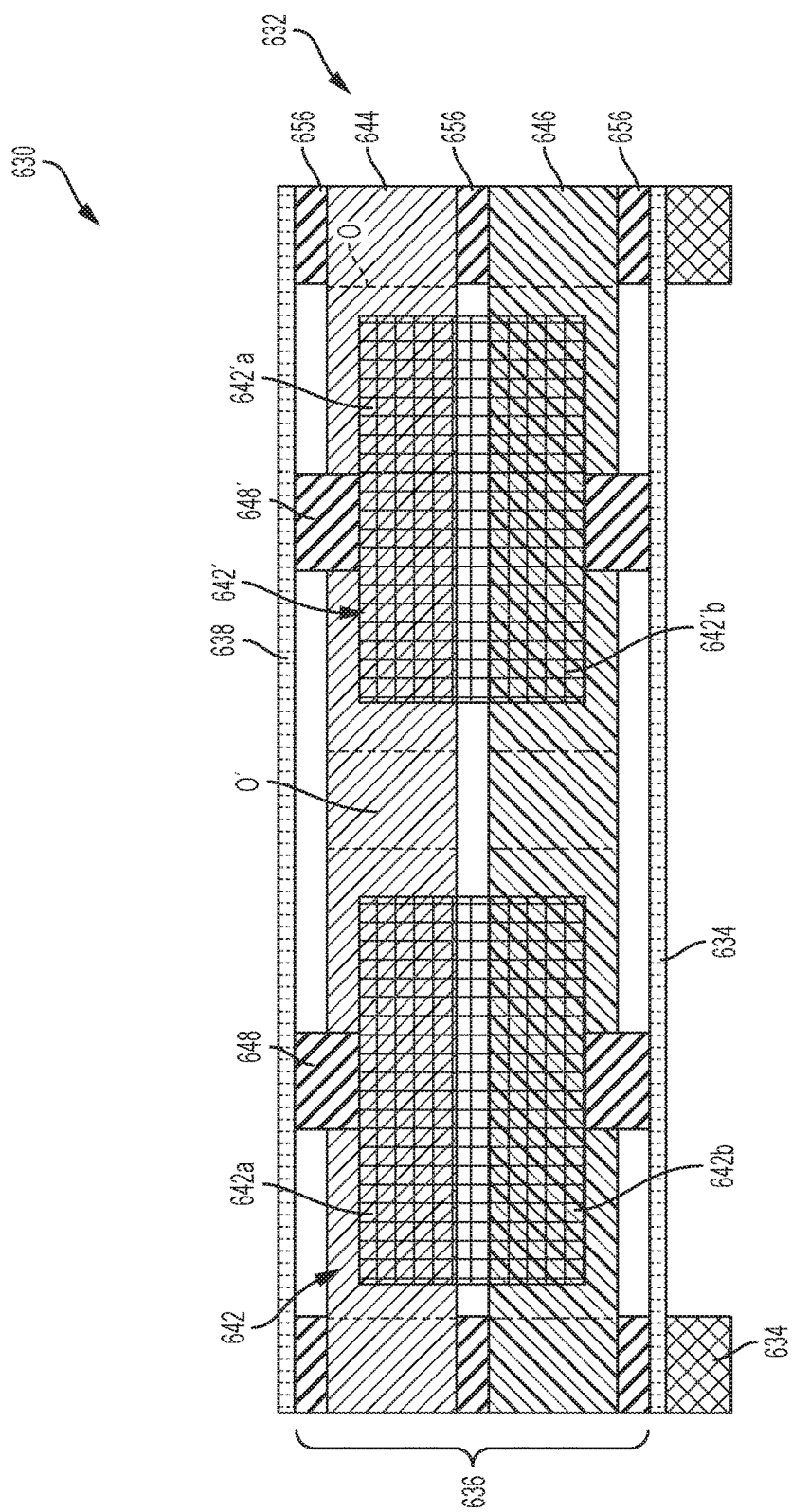

FIGS. 9A and 9B are cross-sectional views of a driving system 632 in accordance with various embodiment of the disclosure. Unlike from the driving system 32 of FIG. 1, two intermediate comb finger counter electrode element 642, 642' are formed in the comb finger counter electrode assembly 636 having separate connecting member 648, 648' coupled the intermediate comb finger counter electrode element 642, 642' to the top and bottom diaphragms 638, 640, respectively. Each of the intermediate comb finger counter electrode element 642, 642' includes a series of comb fingers 642a, 642a' formed around the circumference of the intermediate comb finger counter electrode element 642, 642'. The comb fingers 642a, 642'a project and extend toward the comb finger 644a, 646a of the comb finger counter electrode element 644, 646. One end of the connecting member 648, 648' are attached to either the top or bottom diaphragm 638, 640, and the opposite ends of the connecting member 648, 648' are attached to the center portion of the intermediate comb finger counter electrode element 642, 642'. As the sound waves impinge on one of the diaphragms 638, 640, one of the diaphragms 638, 640 vibrates up and down in response to the change in air pressure caused by the sound waves. The movement of one of the diaphragms 638, 640 in turn cause a movement of the intermediate comb finger counter electrode element 642, 642' via the connecting members 648, 648'. Such movement of the intermediate comb finger counter electrode element 642, 642' creates a change in the amount of capacitance between the comb fingers 642a, 642'a of the intermediate comb finger counter electrode element 642, 642' and the comb fingers 644a, 646 of the top and bottom comb finger counter electrode elements 644, 646 which is translated into an electrical signal. Element 644 and 642 are perforated plates in one embodiment. Element 656 can be optional and does not require in certain application. As depicted in FIG. 9B, optional opening O' located at the center of the driving system for receiving connecting members 656 may be formed from any suitable geometry. Alternatively the locations of the opening O' can be anywhere on 644 or 646.

Figure 10:
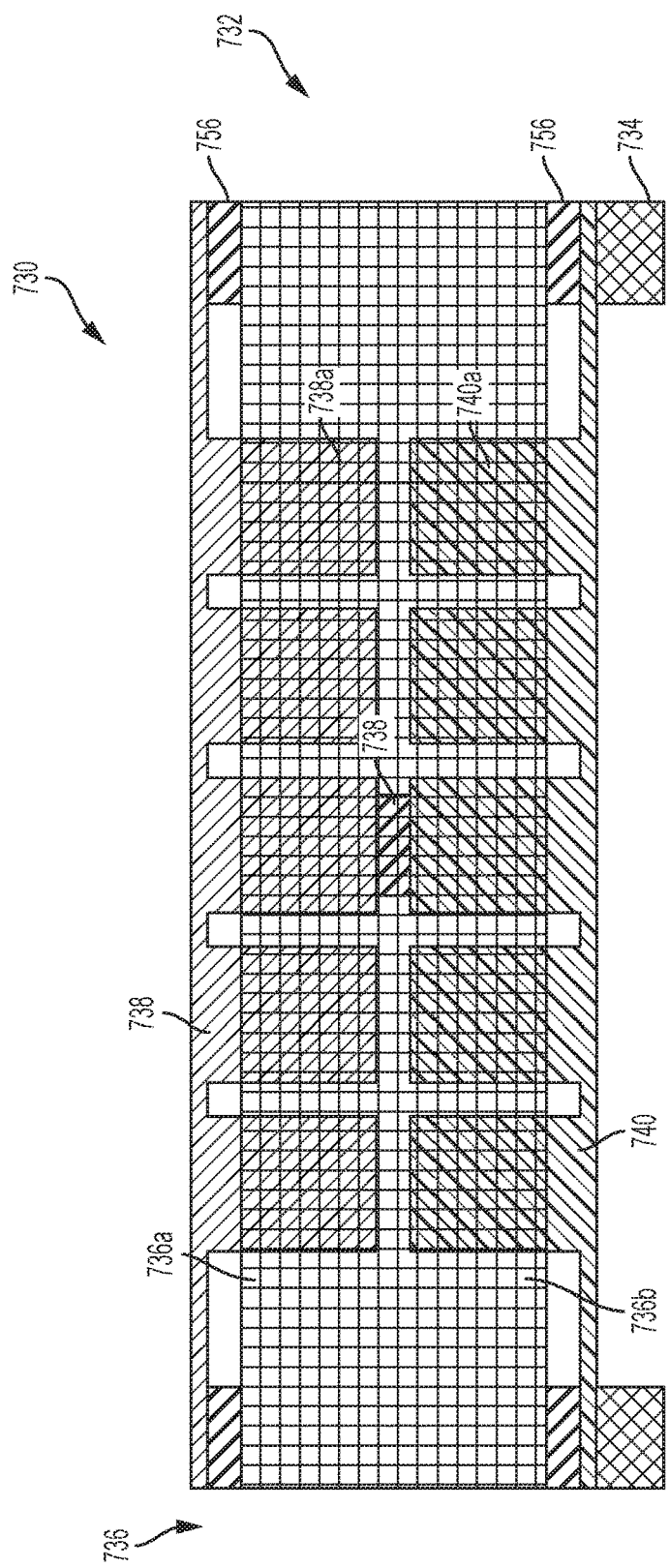
FIG. 10 is a cross-sectional view of a driving system in accordance with a described embodiment of the disclosure.

FIG. 10 is a cross-sectional view of a driving system 732 in accordance with various embodiment of the disclosure. Unlike from the previous driving system wherein the top and bottom comb finger counter electrode elements are built as separate layers. The top and bottom comb finger counter electrode elements in the driving system 732 together with the comb finger electrode assembly 736 formed as a single unit. The driving system 732 includes top and bottom diaphragm 738, 740 with integrated series of comb fingers 738a, 740a face toward and opposite to each other. The comb drive counter electrode assembly 736 includes a peripheral edge portion and a middle portion. Within the middle portion includes a first set of comb fingers 736a and a second set of comb fingers 736b abut to each other configured to receive comb fingers 738a, 740a of the diaphragms 738, 740. In one embodiment, through channels are formed on the first and second sets of comb fingers 736a, 736b to receive at least one of the connecting link or the comb fingers 738a, 740a of the diaphragms 738, 740. In another embodiment, the first and second sets of comb fingers 736a, 736b having outer end portions face toward the diaphragm 738, 740 terminate on the top and bottom surfaces of the comb drive counter electrode assembly 736 and opposite inner end portions terminate at a point within the comb drive counter electrode assembly 736 opposite inner end portions of the first and second sets of comb fingers 736a, 736b do not come in contact with each other. An optional connecting member 738 may be formed between the comb fingers 736a, 736b of the first and second sets of comb fingers 736a, and 736b. The comb drive counter electrode assembly 736 and the diaphragms 738, 740 are insulated by a materials 756 formed in between.

The diaphragms 738, 740 include a series of comb fingers 38a, 40a extended toward and projected inwardly to the first and second set of the comb fingers 736a, 736b. As the sound waves impinge on one of the diaphragms 738, 740, one of the diaphragms 738, 740 vibrates up and down in response to the change in air pressure caused by the sound waves. The movement of one of the diaphragms 738, 740 in turn cause a movement of the comb fingers 736a, 736b, i.e. toward the comb fingers 736a and outward of the comb fingers 736a in an up and down motion. Such movement of the diaphragms 738, 740 creates a change in the amount of capacitance between the comb fingers 736a, 736b of the diaphragms 738, 740 and the comb fingers 736a.

Figure 11A:
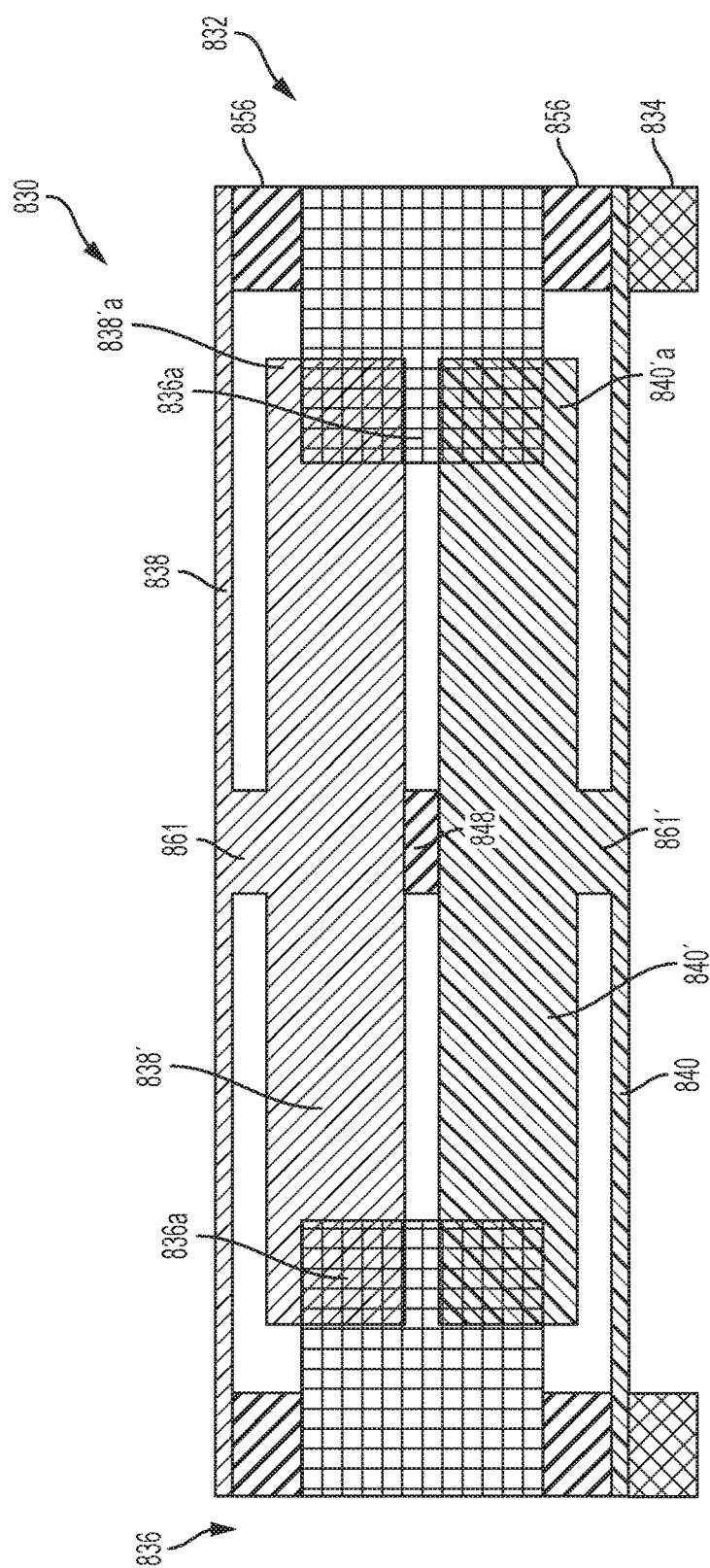
FIGS. 11A and 11B are cross-sectional view of a driving system in accordance with various described embodiments of the disclosure.
Figure 11B:
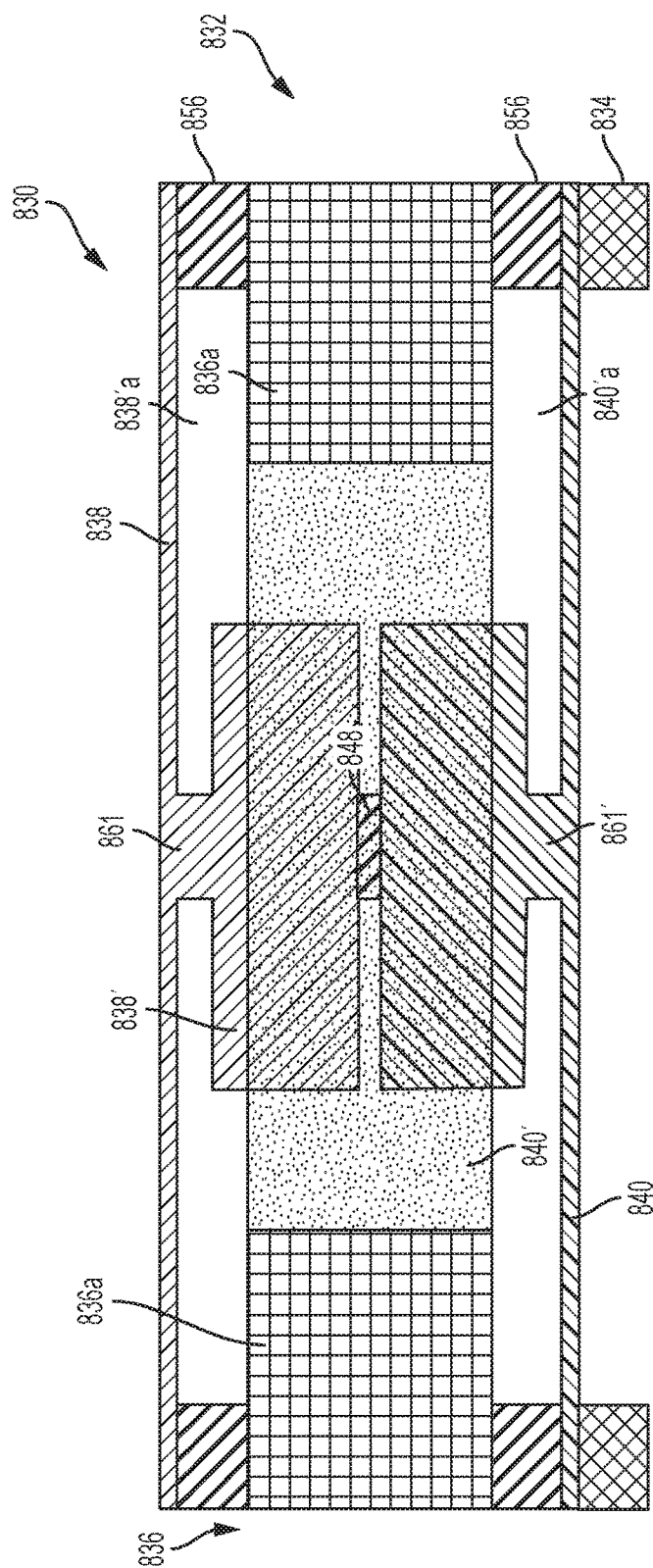

FIG. 11 is a cross-sectional view of a driving system 832 in accordance with various embodiment of the disclosure. The driving system 832 is similar to the driving system 732 of FIG. 10, except the electrode assembly includes a first and second members 838', 840' suspended from and connected to the diaphragms 838, 840 via bridges 861, 861'. The peripheral edge of the first and second members 838', 840' include a series of comb fingers 838'a, 840'a projected outwardly. The comb finger counter electrode assembly 836 includes a series of comb fingers 836a projected inwardly and toward the comb fingers 838'a, 840'a of the first and second members 838', 840'. An optional connecting member 848 may be provided between the suspended first and second members 838', 840'. As the sound waves impinge on one of the diaphragms 838, 840, one of the diaphragms 838, 840 vibrates up and down in response to the change in air pressure caused by the sound waves. The movement of one of the diaphragms 838, 840 in turn cause a movement of the suspended first and second 838', 840'. Such movement of the suspended first and second 838', 840' causes the comb fingers 838'a, 840'a in and out of the comb fingers 836a which then creates a change in the amount of capacitance between the comb fingers comb fingers 838'a, 840'a and the comb fingers 836a.

Figure 12:
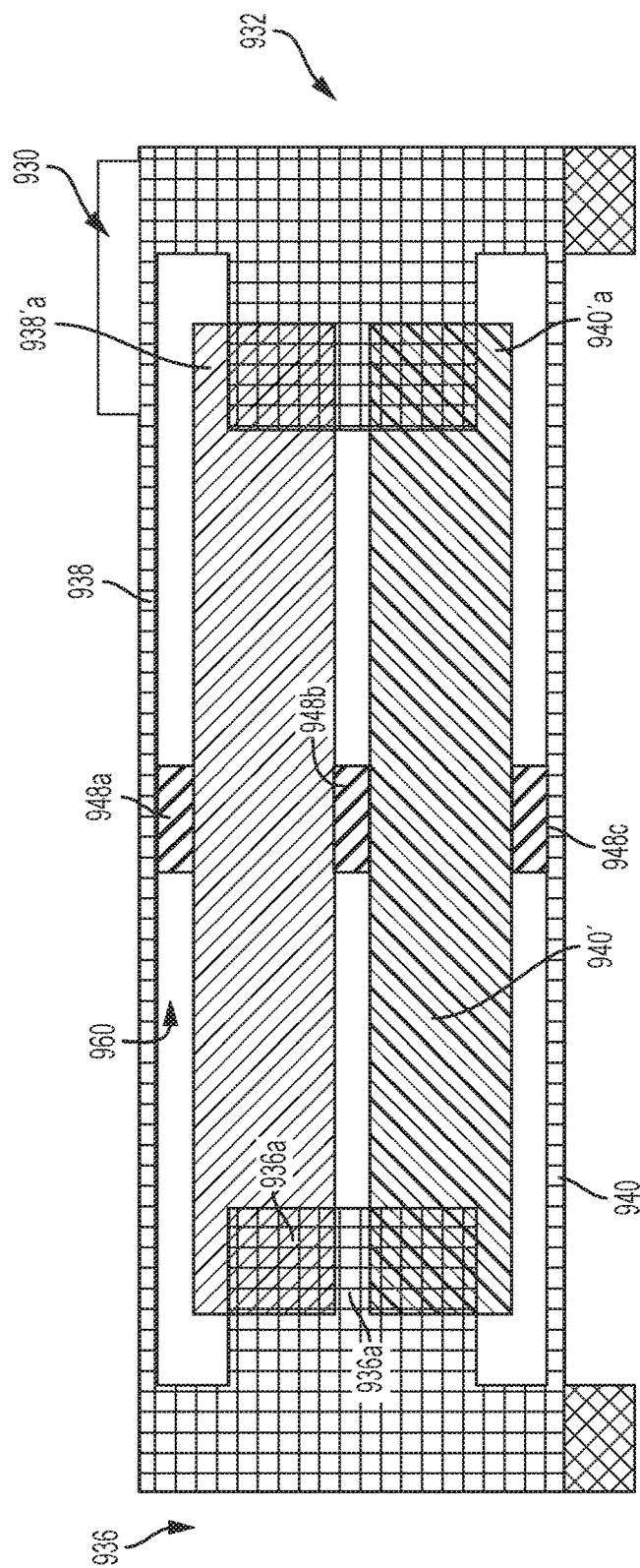
FIG. 12 is a cross-sectional view of a driving system in accordance with a described embodiment of the disclosure.

FIG. 12 is a cross-sectional view of a driving system 932 in accordance with various embodiment of the disclosure. The driving system 932 is similar to the driving system 732 of FIG. 10, except the bridges 861, 861' for connecting first and second members 938', 940' to the diaphragms 938, 940 is replaced by a connecting assembly 948. The first and second members 938', 940' and the diaphragms 938, 940 are now built as separate members. A first connecting member 948a coupled the diaphragm 938 to the first member 938'. A second connecting member 948b coupled between the first and second member 938', 940'. A third connecting member 948c coupled the diaphragm 940 to the second member 940'. Instead of fabrication the comb finger counter electrode assembly 936 as separate assembly as depicted in FIG. 11, the comb finger counter electrode assembly 936 formed as an integral to the top and bottom diaphragm 938, 940. A series of comb finger 936a is formed in the comb finger counter electrode assembly 936 and is projected inwardly and toward the comb fingers 938'a, 940'a of the first and second members 938', 940'. As the sound waves impinge on one of the diaphragms 938, 940, one of the diaphragms 938, 940 vibrates up and down in response to the change in air pressure caused by the sound waves. The movement of one of the diaphragms 938, 940 in turn cause a movement of the first and second members 938', 940' via the connecting assembly 948. Such movement of the first and second members 938', 940' causes the comb fingers 938'a, 940'a in and out of the comb fingers 936a which then creates a change in the amount of capacitance between the comb fingers comb fingers 938'a, 940'a and the comb fingers 936a.

In order to form a certain pressure in the electrode region 960 the diaphragm 938 contains a sealing element 930 which covers at least partly the diaphragm 938. The sealing element 930 is formed during fabrication of the driving system 932 to seal the electrode region 960. Before sealing the electrode region 960 there is an opening instead of the sealing element 930.

In one embodiment the driving system 932 is a part of a MEMS microphone or a MEMS pressure sensor. The electrode region 960 is formed during fabrication which includes a release step after which there is an opening at the location of 930. The pressure (e.g. vacuum) in the electrode region 960 is formed through the opening by e.g. evacuating the electrode region 960. The target pressure is achieved by sealing the opening while the electrode region is having a suitable pressure. The sealing is happening by closing the opening with the seal element 930 at the suitable pressure.

Figure 13:
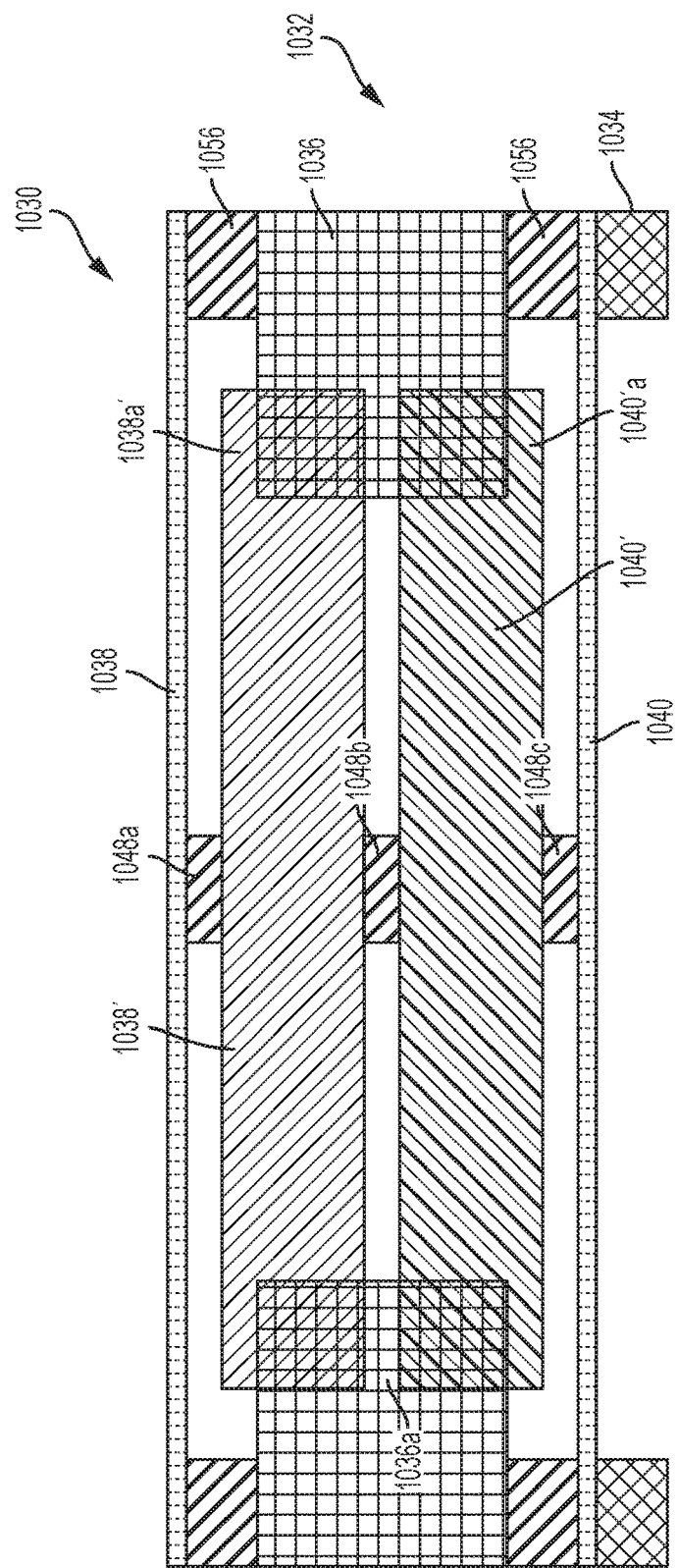
FIG. 13 is a cross-sectional view of a driving system in accordance with a described embodiment of the disclosure.

FIG. 13 is a cross-sectional view of a driving system 1032 in accordance with various embodiment of the disclosure. The configuration of the driving system 1032 formed a combined configuration of the first and second members 938', 940' driving system 932 of FIG. 12 and the electrode assembly 836 of driving system 832 of FIG. 11. As the sound waves impinge on one of the diaphragms 1038, 1040, one of the diaphragms 1038, 1040 vibrates up and down in response to the change in air pressure caused by the sound waves. The movement of one of the diaphragms 1038, 1040 in turn cause a movement of the first and second members 1038', 1040' via the connecting assembly 1048. Such movement of the first and second members 1038', 1040' causes the comb fingers 1038'a, 1040'a in and out of the comb fingers 1036a which then creates a change in the amount of capacitance between the comb fingers comb fingers 1038'a, 1040'a and the comb fingers 1036a.

The embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling with the spirit and scope of this disclosure.

While the patent has been described with reference to various embodiments, it will be understood that these embodiments are illustrative and that the scope of the disclosure is not limited to them. Many variations, modifications, additions, and improvements are possible. More generally, embodiments in accordance with the patent have been described in the context or particular embodiments. Functionality may be separated or combined in blocks differently in various embodiments of the disclosure or described with different terminology. These and other variations, modifications, additions, and improvements may fall within the scope of the disclosure as defined in the claims that follow.

What is claimed is:

1. A microelectromechanical system (MEMS) microphone comprising:
   a base unit;
   a driving system disposed on the base unit, the driving system comprising:
      a first diaphragm;
      a first stationary comb finger electrode extending from the first diaphragm;
      a second diaphragm spaced apart from the first diaphragm; and
      a second stationary comb finger electrode extending from the second diaphragm and spaced apart from the first stationary comb finger electrode;
   a comb finger counter electrode assembly comprising a moving comb finger electrode member configured for movement relative to the first stationary comb finger electrode and the second stationary comb finger electrode, the counter electrode assembly extending from the first diaphragm and the second diaphragm, and the moving comb finger electrode member interdigitated with the first stationary comb finger electrode and the second stationary comb finger electrode; and
   a side wall mechanically coupled to the first diaphragm and to the second diaphragm, the first diaphragm, the second diaphragm, and the side wall defining a sealed electrode region;
   wherein the sealed electrode region has an encapsulated gas pressure and the comb finger counter electrode assembly is disposed within the sealed electrode region.

2. The MEMS microphone of claim 1 wherein the first diaphragm is substantially made of a material having a low conductivity and the second diaphragm is substantially made of a material having a low conductivity.

3. The MEMS microphone of claim 1 wherein the moving comb finger electrode member is substantially made of a material having a conductivity.

4. The MEMS microphone of claim 2 wherein one or more of the first diaphragm and the second diaphragm are substantially made of a material having a tensile residual stress.

5. The MEMS microphone of claim 1 wherein the comb finger counter electrode assembly comprising a material having a tensile residual stress.

6. The MEMS microphone of claim 1 further comprising:
   a connecting member extending directly from the first diaphragm and the second diaphragm and configured to mechanically couple the comb finger counter electrode assembly to the first diaphragm and the second diaphragm.

7. The MEMS microphone of claim 6 further comprising:
   one or more pillars formed within the driving system.

8. A microelectromechanical (MEMS) microphone comprising:
- a base unit;
- a driving system disposed on the base unit, the driving system comprising:
  - a first diaphragm; and
  - a second diaphragm spaced apart from the first diaphragm;
- a comb finger counter electrode assembly comprising a moving electrode member, the counter electrode assembly is mechanically coupled to the first and second diaphragms; and
- a side wall mechanically coupled the first diaphragm to the second diaphragm defining a sealed electrode region;
- one or more pillars formed within the driving system; and
- a leak hole formed on the one or more pillars,
- wherein the sealed electrode region has an encapsulated gas pressure and the comb finger counter electrode assembly is disposed within the sealed electrode region.

9. The MEMS microphone of claim 5 wherein the comb finger counter electrode assembly comprises at least two moving comb finger electrode members formed within the sealed electrode region.

10. A driving system for a microelectromechanical system (MEMS) microphone comprising:
- an electrode assembly comprising:
  - a first diaphragm;
  - a first stationary comb finger electrode extending from the first diaphragm;
  - a second diaphragm spaced apart from the first diaphragm;
  - a second stationary comb finger electrode extending from the second diaphragm and spaced apart from the first stationary comb finger electrode; and
  - a gap formed between the first and second diaphragm;
- a comb finger counter electrode assembly formed within the first and second diaphragms, the comb finger counter electrode assembly comprising:
  - a moving comb finger electrode member configured for movement relative to the first stationary comb finger electrode and the second stationary comb finger electrode, and the moving comb finger electrode member interdigitated with the first stationary comb finger electrode and the second stationary comb finger electrode;

and
- a side wall mechanically coupled to the first stationary comb finger electrode, the second stationary comb finger electrode, the first diaphragm, and the second diaphragm, with the first diaphragm, the second diaphragm, and the side wall defining a sealed electrode region;
- wherein the sealed electrode region has an encapsulated gas pressure and the comb finger counter electrode assembly is disposed within the sealed electrode region.

11. The driving system of claim 10 wherein the first diaphragm is substantially made of a material having a low conductivity and the second diaphragm is substantially made of a material having a low conductivity.

12. The driving system of claim 10 wherein the moving comb finger electrode member is substantially made of a material having a conductivity.

13. The driving system of claim 11 wherein one or more of the diaphragms are substantially made of a material having a tensile residual stress.

14. The driving system of claim 10 wherein the comb finger counter electrode assembly comprising a material having a tensile residual stress.

15. The driving system of claim 10 further comprising a connecting member mechanically coupled the counter electrode assembly to the first and second diaphragms.

16. The driving system of claim 15 further comprising one or more pillars formed within the driving system.

17. The driving system of claim 16 further comprising a leak hole formed on the one or more pillars.

18. The driving system of claim 14 wherein the comb finger counter electrode assembly comprises at least two moving comb finger electrode member formed within the sealed electrode region.

* * * * *